US012740412B2

(12) United States Patent
Costa et al.

(10) Patent No.: US 12,740,412 B2
(45) Date of Patent: Sep. 15, 2026

(54) RF DEVICES WITH NANOTUBE PARTICLES FOR ENHANCED PERFORMANCE AND METHODS OF FORMING THE SAME

(71) Applicant: Qorvo US, Inc., Greensboro, NC (US)

(72) Inventors: Julio C. Costa, Oak Ridge, NC (US); Todd Gillenwater, Summerfield, NC (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 18/430,216

(22) Filed: Feb. 1, 2024

(65) Prior Publication Data

US 2024/0234241 A1 Jul. 11, 2024

Related U.S. Application Data

(63) Continuation of application No. 16/844,406, filed on Apr. 9, 2020, now Pat. No. 12,074,086.
(Continued)

(51) Int. Cl.
*H10P 72/70* (2026.01)
*H10D 30/69* (2025.01)
(Continued)

(52) U.S. Cl.
CPC ........ *H10W 40/255* (2026.01); *H10D 30/791* (2025.01); *H10D 62/822* (2025.01);
(Continued)

(58) Field of Classification Search
CPC ........... H01L 23/3735; H01L 21/30604; H01L 21/565; H01L 21/6835; H01L 21/76224;
(Continued)

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 1256300 A 6/2000
CN 1696231 A 11/2005
(Continued)

OTHER PUBLICATIONS

US 10,896,908 B2, 01/2021, Costa et al. (withdrawn)
(Continued)

*Primary Examiner* — David Chen
(74) *Attorney, Agent, or Firm* — Withrow & Terranova, P.L.L.C.

(57) ABSTRACT

The present disclosure relates to a radio frequency device that includes a mold device die and a multilayer redistribution structure underneath the mold device die. The mold device die includes a device region with a back-end-of-line (BEOL) portion and a front-end-of-line (FEOL) portion over the BEOL portion, and a first mold compound with nanotube particles. The FEOL portion includes isolation sections and an active layer surrounded by the isolation sections. The nanotube particles are dispersed throughout a bottom portion of the first mold compound, and have a higher thermal conductivity than the first mold compound alone. The bottom portion of the first mold compound resides over the active layer and top surfaces of the isolation sections. The multilayer redistribution structure includes a number of bump structures, which are at a bottom of the multilayer redistribution structure and electrically coupled to the FEOL portion of the mold device die.

26 Claims, 13 Drawing Sheets

Related U.S. Application Data

(60) Provisional application No. 62/929,530, filed on Nov. 1, 2019.

(51) Int. Cl.

*H10D 62/822* (2025.01)
*H10P 14/60* (2026.01)
*H10P 14/692* (2026.01)
*H10P 50/64* (2026.01)
*H10W 10/00* (2026.01)
*H10W 10/17* (2026.01)
*H10W 40/22* (2026.01)
*H10W 40/25* (2026.01)
*H10W 70/685* (2026.01)
*H10W 74/01* (2026.01)
*H10W 74/10* (2026.01)
*H10W 74/43* (2026.01)
*H10W 72/00* (2026.01)

(52) U.S. Cl.

CPC .... *H10P 14/6342* (2026.01); *H10P 14/69215* (2026.01); *H10P 50/642* (2026.01); *H10P 72/74* (2026.01); *H10W 10/014* (2026.01); *H10W 10/17* (2026.01); *H10W 40/22* (2026.01); *H10W 70/685* (2026.01); *H10W 74/016* (2026.01); *H10W 74/117* (2026.01); *H10W 74/121* (2026.01); *H10W 74/137* (2026.01); *H10W 74/147* (2026.01); *H10W 74/43* (2026.01); *H10P 14/6336* (2026.01); *H10P 14/6339* (2026.01); *H10W 72/0198* (2026.01)

(58) Field of Classification Search

CPC ............ H01L 23/3128; H01L 23/3135; H01L 23/3675; H10D 30/791; H10D 62/822; H10D 30/751; H10D 86/01; H10P 72/74; H10P 72/7416; H10P 72/7422; H10P 54/00; H10W 74/117; H10W 72/0198; H10W 42/00; H10W 40/25; H10W 40/778; H10W 90/701; H10W 74/014; H10W 74/019

USPC ........................ 438/113, 126, 127, 151, 618

See application file for complete search history.

(56) References Cited

U.S. PATENT DOCUMENTS 5,013,681 A 5/1991 Godbey et al.
5,061,663 A 10/1991 Bolt et al.
5,069,626 A 12/1991 Patterson et al.
5,164,687 A 11/1992 Kurian et al.
5,294,295 A 3/1994 Gabriel
5,362,972 A 11/1994 Yazawa et al.
5,391,257 A 2/1995 Sullivan et al.
5,459,368 A 10/1995 Onishi et al.
5,646,432 A 7/1997 Iwaki et al.
5,648,013 A 7/1997 Uchida et al.
5,653,841 A 8/1997 Krishnamurthy et al.
5,699,027 A 12/1997 Tsuji et al.
5,709,960 A 1/1998 Mays et al.
5,729,075 A 3/1998 Strain
5,831,369 A 11/1998 Fürbacher et al.
5,920,142 A 7/1999 Onishi et al.
6,072,557 A 6/2000 Kishimoto
6,084,284 A 7/2000 Adamic, Jr.
6,137,125 A 10/2000 Costas et al.
6,154,366 A 11/2000 Ma et al.
6,154,372 A 11/2000 Kalivas et al.
6,235,554 B1 5/2001 Akram et al.
6,236,061 B1 5/2001 Walpita
6,268,654 B1 7/2001 Glenn et al.
6,271,469 B1 8/2001 Ma et al.
6,377,112 B1 4/2002 Rozsypal
6,423,570 B1 7/2002 Ma et al.
6,426,559 B1 7/2002 Bryan et al.
6,441,498 B1 8/2002 Song
6,446,316 B1 9/2002 Fürbacher et al.
6,578,458 B1 6/2003 Akram et al.
6,649,012 B2 11/2003 Masayuki et al.
6,696,901 B1 2/2004 Takeda et al.
6,703,688 B1 3/2004 Fitzergald
6,713,859 B1 3/2004 Ma
6,841,413 B2 1/2005 Liu et al.
6,864,156 B1 3/2005 Conn
6,864,540 B1 3/2005 Divakaruni et al.
6,902,950 B2 6/2005 Ma et al.
6,943,429 B1 9/2005 Glenn et al.
6,964,889 B2 11/2005 Ma et al.
6,992,400 B2 1/2006 Tikka et al.
7,042,072 B1 5/2006 Kim et al.
7,049,692 B2 5/2006 Nishimura et al.
7,064,391 B1 6/2006 Conn
7,109,635 B1 9/2006 McClure et al.
7,183,172 B2 2/2007 Lee et al.
7,190,064 B2 3/2007 Wakabayashi et al.
7,238,560 B2 7/2007 Sheppard et al.
7,279,750 B2 10/2007 Jobetto
7,288,435 B2 10/2007 Aigner et al.
7,307,003 B2 12/2007 Reif et al.
7,342,303 B1 3/2008 Berry et al.
7,393,770 B2 7/2008 Wood et al.
7,402,901 B2 7/2008 Hatano et al.
7,427,824 B2 9/2008 Iwamoto et al.
7,489,032 B2 2/2009 Jobetto
7,596,849 B1 10/2009 Carpenter et al.
7,619,347 B1 11/2009 Bhattacharjee
7,635,636 B2 12/2009 McClure et al.
7,714,535 B2 5/2010 Yamazaki et al.
7,723,838 B2 5/2010 Takeuchi et al.
7,749,882 B2 7/2010 Kweon et al.
7,790,543 B2 9/2010 Abadeer et al.
7,816,231 B2 10/2010 Dyer et al.
7,843,072 B1 11/2010 Park et al.
7,855,101 B2 12/2010 Furman et al.
7,868,419 B1 1/2011 Kerr et al.
7,910,405 B2 3/2011 Okada et al.
7,955,955 B2 6/2011 Lane et al.
7,960,218 B2 6/2011 Ma et al.
8,004,089 B2 8/2011 Jobetto
8,183,151 B2 5/2012 Lake
8,299,633 B2 10/2012 Su
8,420,447 B2 4/2013 Tay et al.
8,503,186 B2 8/2013 Lin et al.
8,563,403 B1 10/2013 Farooq et al.
8,568,547 B2 10/2013 Yamazaki et al.
8,643,148 B2 2/2014 Lin et al.
8,658,475 B1 2/2014 Kerr
8,664,044 B2 3/2014 Jin et al.
8,772,853 B2 7/2014 Hong et al.
8,791,532 B2 7/2014 Graf et al.
8,802,495 B2 8/2014 Kim et al.
8,803,242 B2 8/2014 Marino et al.
8,816,407 B2 8/2014 Kim et al.
8,835,978 B2 9/2014 Mauder et al.
8,906,755 B1 12/2014 Hekmatshoartabari et al.
8,921,990 B2 12/2014 Park et al.
8,927,968 B2 1/2015 Cohen et al.
8,941,248 B2 1/2015 Lin et al.
8,963,321 B2 2/2015 Lenniger et al.
8,983,399 B2 3/2015 Kawamura et al.
9,064,883 B2 6/2015 Meyer et al.
9,165,793 B1 10/2015 Wang et al.
9,214,337 B2 12/2015 Carroll et al.
9,349,700 B2 5/2016 Hsieh et al.
9,368,429 B2 6/2016 Ma et al.
9,406,637 B2 8/2016 Wakisaka et al.
9,461,001 B1 10/2016 Tsai et al.
9,520,428 B2 12/2016 Fujimori
9,530,709 B2 12/2016 Leipold et al.

(56) References Cited

U.S. PATENT DOCUMENTS 9,613,831 B2 4/2017 Morris et al.
9,646,856 B2 5/2017 Meyer et al.
9,653,428 B1 5/2017 Hiner et al.
9,698,081 B2 7/2017 Yu et al.
9,786,586 B1 10/2017 Shih
9,812,350 B2 11/2017 Costa
9,824,951 B2 11/2017 Leipold et al.
9,824,974 B2 11/2017 Gao et al.
9,859,254 B1 1/2018 Yu et al.
9,875,971 B2 1/2018 Bhushan et al.
9,941,245 B2 4/2018 Skeete et al.
10,134,837 B1 11/2018 Fanelli et al.
10,492,301 B2 11/2019 Costa et al.
10,727,212 B2 7/2020 Moon et al.
10,784,348 B2 9/2020 Fanelli et al.
10,882,740 B2 1/2021 Costa et al.
12,199,065 B2 1/2025 Yu et al.
2001/0004131 A1 6/2001 Masayuki et al.
2002/0070443 A1 6/2002 Mu et al.
2002/0074641 A1 6/2002 Towle et al.
2002/0093392 A1 7/2002 Ohata et al.
2002/0127769 A1 9/2002 Ma et al.
2002/0127780 A1 9/2002 Ma et al.
2002/0137263 A1 9/2002 Towle et al.
2002/0185675 A1 12/2002 Furukawa
2003/0207515 A1 11/2003 Tan et al.
2004/0021152 A1 2/2004 Nguyen et al.
2004/0093901 A1 5/2004 Kim et al.
2004/0164367 A1 8/2004 Park
2004/0166642 A1 8/2004 Chen et al.
2004/0173790 A1 9/2004 Yeo et al.
2004/0219765 A1 11/2004 Reif et al.
2004/0266159 A1 12/2004 Gardecki et al.
2005/0037595 A1 2/2005 Nakahata
2005/0064686 A1* 3/2005 Chidambarrao ..... H10D 30/751 438/518
2005/0077511 A1 4/2005 Fitzergald
2005/0079686 A1 4/2005 Aigner et al.
2005/0212419 A1 9/2005 Vazan et al.
2005/0258447 A1 11/2005 Oi et al.
2005/0260842 A1 11/2005 Kaltalioglu et al.
2006/0009041 A1 1/2006 Iyer et al.
2006/0057782 A1 3/2006 Gardes et al.
2006/0099781 A1 5/2006 Beaumont et al.
2006/0105496 A1 5/2006 Chen et al.
2006/0108585 A1 5/2006 Gan et al.
2006/0110887 A1 5/2006 Huang
2006/0124961 A1 6/2006 Sakaguchi et al.
2006/0228074 A1 10/2006 Lipson et al.
2006/0261446 A1 11/2006 Wood et al.
2007/0020807 A1 1/2007 Geefay et al.
2007/0034910 A1 2/2007 Shie
2007/0045738 A1 3/2007 Jones et al.
2007/0069393 A1 3/2007 Asahi et al.
2007/0075317 A1 4/2007 Kato et al.
2007/0121326 A1 5/2007 Nall et al.
2007/0122943 A1 5/2007 Foong et al.
2007/0158746 A1 7/2007 Ohguro
2007/0181992 A1 8/2007 Lake
2007/0190747 A1 8/2007 Humpston et al.
2007/0194342 A1 8/2007 Kinzer
2007/0252481 A1 11/2007 Iwamoto et al.
2007/0276092 A1 11/2007 Kanae et al.
2008/0020513 A1 1/2008 Jobetto
2008/0050852 A1 2/2008 Hwang et al.
2008/0050901 A1 2/2008 Kweon et al.
2008/0087959 A1 4/2008 Monfray et al.
2008/0157303 A1 7/2008 Yang
2008/0164528 A1 7/2008 Cohen et al.
2008/0251927 A1 10/2008 Zhao et al.
2008/0265978 A1 10/2008 Englekirk
2008/0272497 A1 11/2008 Lake
2008/0277800 A1 11/2008 Hwang et al.
2008/0315372 A1 12/2008 Kuan et al.
2009/0008714 A1 1/2009 Chae
2009/0010056 A1 1/2009 Kuo et al.
2009/0014856 A1 1/2009 Knickerbocker
2009/0090979 A1 4/2009 Zhu et al.
2009/0179266 A1 7/2009 Abadeer et al.
2009/0230542 A1 9/2009 Lin et al.
2009/0243097 A1 10/2009 Koroku et al.
2009/0261460 A1 10/2009 Kuan et al.
2009/0302484 A1 12/2009 Lee et al.
2010/0003803 A1 1/2010 Oka et al.
2010/0012354 A1 1/2010 Hedin et al.
2010/0029045 A1 2/2010 Ramanathan et al.
2010/0045145 A1 2/2010 Tsuda
2010/0081232 A1 4/2010 Furman et al.
2010/0081237 A1 4/2010 Wong et al.
2010/0105209 A1 4/2010 Winniczek et al.
2010/0109122 A1 5/2010 Ding et al.
2010/0120204 A1 5/2010 Kunimoto
2010/0127340 A1 5/2010 Sugizaki
2010/0173436 A1 7/2010 Ouellet et al.
2010/0200919 A1 8/2010 Kikuchi
2010/0314637 A1 12/2010 Kim et al.
2011/0003433 A1 1/2011 Harayama et al.
2011/0018126 A1 1/2011 Kling et al.
2011/0026232 A1 2/2011 Lin et al.
2011/0036400 A1 2/2011 Murphy et al.
2011/0062549 A1 3/2011 Lin
2011/0068433 A1 3/2011 Kim et al.
2011/0102002 A1 5/2011 Riehl et al.
2011/0133341 A1 6/2011 Shimizu et al.
2011/0171792 A1 7/2011 Chang et al.
2011/0227158 A1 9/2011 Zhu
2011/0272800 A1 11/2011 Chino
2011/0272824 A1 11/2011 Pagaila
2011/0294244 A1 12/2011 Hattori et al.
2011/0309481 A1 12/2011 Huang et al.
2012/0003813 A1 1/2012 Chuang et al.
2012/0045871 A1 2/2012 Lee et al.
2012/0068276 A1 3/2012 Lin et al.
2012/0091520 A1 4/2012 Nakamura
2012/0094418 A1 4/2012 Grama et al.
2012/0098074 A1 4/2012 Lin et al.
2012/0104495 A1 5/2012 Zhu et al.
2012/0119346 A1 5/2012 Im et al.
2012/0153393 A1 6/2012 Liang et al.
2012/0168863 A1 7/2012 Zhu et al.
2012/0256260 A1 10/2012 Cheng et al.
2012/0292700 A1 11/2012 Khakifirooz et al.
2012/0299105 A1 11/2012 Cai et al.
2012/0313243 A1 12/2012 Chang et al.
2013/0001665 A1 1/2013 Zhu et al.
2013/0015429 A1 1/2013 Hong et al.
2013/0037929 A1 2/2013 Essig et al.
2013/0049205 A1 2/2013 Meyer et al.
2013/0082399 A1 4/2013 Kim et al.
2013/0099315 A1 4/2013 Zhu et al.
2013/0105966 A1 5/2013 Kelkar et al.
2013/0147009 A1 6/2013 Kim
2013/0155681 A1 6/2013 Nall et al.
2013/0196483 A1 8/2013 Dennard et al.
2013/0200456 A1 8/2013 Zhu et al.
2013/0221493 A1 8/2013 Kim et al.
2013/0241040 A1 9/2013 Tojo et al.
2013/0280826 A1 10/2013 Scanlan et al.
2013/0299871 A1 11/2013 Mauder et al.
2013/0334698 A1 12/2013 Mohammed et al.
2014/0015131 A1 1/2014 Meyer et al.
2014/0021583 A1 1/2014 Lo et al.
2014/0035129 A1 2/2014 Stuber et al.
2014/0134803 A1 5/2014 Kelly et al.
2014/0168014 A1 6/2014 Chih et al.
2014/0197530 A1 7/2014 Meyer et al.
2014/0210314 A1 7/2014 Bhattacharjee et al.
2014/0219604 A1 8/2014 Hackler, Sr. et al.
2014/0252566 A1 9/2014 Kerr et al.
2014/0252567 A1 9/2014 Carroll et al.
2014/0264813 A1 9/2014 Lin et al.
2014/0264818 A1 9/2014 Lowe, Jr. et al.
2014/0306324 A1 10/2014 Costa et al.
2014/0323064 A1 10/2014 McCarthy

(56) References Cited

U.S. PATENT DOCUMENTS

2014/0327003 A1 11/2014 Fuergut et al.
2014/0327150 A1 11/2014 Jung et al.
2014/0346573 A1 11/2014 Adam et al.
2014/0356602 A1 12/2014 Oh et al.
2015/0015321 A1 1/2015 Dribinsky et al.
2015/0021754 A1 1/2015 Lin et al.
2015/0060956 A1 3/2015 Chen
2015/0060967 A1 3/2015 Yokoyama et al.
2015/0076713 A1 3/2015 Tsai et al.
2015/0097302 A1 4/2015 Wakisaka et al.
2015/0108666 A1* 4/2015 Engelhardt ....... H10W 72/0198 257/787
2015/0115416 A1 4/2015 Costa et al.
2015/0130045 A1 5/2015 Tseng et al.
2015/0136858 A1 5/2015 Finn et al.
2015/0162307 A1 6/2015 Chen et al.
2015/0171006 A1 6/2015 Hung et al.
2015/0171243 A1 6/2015 Lee
2015/0197419 A1 7/2015 Cheng et al.
2015/0235990 A1 8/2015 Cheng et al.
2015/0235993 A1 8/2015 Cheng et al.
2015/0243881 A1 8/2015 Sankman et al.
2015/0255368 A1 9/2015 Costa
2015/0262844 A1 9/2015 Meyer et al.
2015/0279789 A1 10/2015 Mahajan et al.
2015/0311132 A1 10/2015 Kuo et al.
2015/0364344 A1 12/2015 Yu et al.
2015/0380394 A1 12/2015 Jang et al.
2015/0380523 A1 12/2015 Hekmatshoartabari et al.
2016/0002510 A1 1/2016 Champagne et al.
2016/0056544 A1 2/2016 Garcia et al.
2016/0079137 A1 3/2016 Leipold et al.
2016/0079233 A1 3/2016 Deboy et al.
2016/0093580 A1 3/2016 Scanlan et al.
2016/0100489 A1 4/2016 Costa et al.
2016/0118414 A1 4/2016 Singh et al.
2016/0126111 A1 5/2016 Leipold et al.
2016/0126196 A1 5/2016 Leipold et al.
2016/0133591 A1 5/2016 Hong et al.
2016/0141249 A1 5/2016 Kang et al.
2016/0141263 A1 5/2016 Lin et al.
2016/0155706 A1 6/2016 Yoneyama et al.
2016/0260745 A1 9/2016 Huang et al.
2016/0284568 A1 9/2016 Morris et al.
2016/0284570 A1 9/2016 Morris et al.
2016/0300771 A1 10/2016 Lin
2016/0343592 A1 11/2016 Costa et al.
2016/0343604 A1 11/2016 Costa et al.
2016/0347609 A1 12/2016 Yu et al.
2016/0362292 A1 12/2016 Chang et al.
2017/0005000 A1 1/2017 Beyne
2017/0024503 A1 1/2017 Connelly
2017/0032957 A1 2/2017 Costa et al.
2017/0033026 A1 2/2017 Ho et al.
2017/0053938 A1 2/2017 Whitefield
2017/0062284 A1 3/2017 Mason et al.
2017/0062366 A1 3/2017 Enquist
2017/0077028 A1 3/2017 Maxim et al.
2017/0084596 A1 3/2017 Scanlan
2017/0098587 A1 4/2017 Leipold et al.
2017/0190572 A1 7/2017 Pan et al.
2017/0200648 A1 7/2017 Lee et al.
2017/0207350 A1 7/2017 Leipold et al.
2017/0263539 A1 9/2017 Gowda et al.
2017/0271200 A1 9/2017 Costa
2017/0323804 A1 11/2017 Costa et al.
2017/0323860 A1 11/2017 Costa et al.
2017/0334710 A1 11/2017 Costa et al.
2017/0358511 A1 12/2017 Costa et al.
2018/0005991 A1 1/2018 Seidemann et al.
2018/0019184 A1 1/2018 Costa et al.
2018/0019185 A1 1/2018 Costa et al.
2018/0042110 A1 2/2018 Cok
2018/0044169 A1 2/2018 Hatcher, Jr. et al.
2018/0044177 A1 2/2018 Vandemeer et al.
2018/0047653 A1 2/2018 Costa et al.
2018/0076174 A1 3/2018 Costa et al.
2018/0138082 A1 5/2018 Costa et al.
2018/0138092 A1 5/2018 Lee et al.
2018/0138227 A1 5/2018 Shimotsusa et al.
2018/0145678 A1 5/2018 Maxim et al.
2018/0151461 A1 5/2018 Cho
2018/0166358 A1 6/2018 Costa et al.
2018/0174948 A1 6/2018 Butt et al.
2018/0240759 A1 8/2018 Haji-Rahim et al.
2018/0240797 A1 8/2018 Yokoyama et al.
2018/0261470 A1 9/2018 Costa et al.
2018/0269188 A1 9/2018 Yu et al.
2018/0275485 A1 9/2018 Hurwitz
2018/0277632 A1 9/2018 Fanelli et al.
2018/0331041 A1 11/2018 Liao et al.
2018/0342439 A1 11/2018 Costa et al.
2019/0013254 A1 1/2019 Costa et al.
2019/0013255 A1 1/2019 Costa et al.
2019/0043812 A1 2/2019 Leobandung
2019/0057922 A1 2/2019 Costa et al.
2019/0074263 A1 3/2019 Costa et al.
2019/0074271 A1 3/2019 Costa et al.
2019/0104653 A1 4/2019 Jandzinski et al.
2019/0172826 A1 6/2019 Or-Bach et al.
2019/0172842 A1 6/2019 Whitefield
2019/0189599 A1 6/2019 Baloglu et al.
2019/0229101 A1 7/2019 Lee
2019/0237421 A1 8/2019 Tsuchiya
2019/0287953 A1 9/2019 Moon et al.
2019/0288006 A1 9/2019 Paul
2019/0304910 A1 10/2019 Fillion
2019/0304977 A1 10/2019 Costa et al.
2019/0312110 A1 10/2019 Costa et al.
2019/0326159 A1 10/2019 Costa et al.
2019/0378819 A1 12/2019 Costa et al.
2019/0378821 A1 12/2019 Costa et al.
2020/0006193 A1 1/2020 Costa et al.
2020/0027814 A1 1/2020 Ichiryu et al.
2020/0058541 A1 2/2020 Konishi et al.
2020/0115220 A1 4/2020 Hammond et al.
2020/0118838 A1 4/2020 Hammond et al.
2020/0176347 A1 6/2020 Costa et al.
2020/0234978 A1 7/2020 Costa et al.
2020/0235024 A1 7/2020 Costa et al.
2020/0235040 A1 7/2020 Costa et al.
2020/0235054 A1 7/2020 Costa et al.
2020/0235059 A1 7/2020 Cok et al.
2020/0235066 A1 7/2020 Costa et al.
2020/0235074 A1 7/2020 Costa et al.
2021/0134699 A1 5/2021 Costa et al.
2021/0167031 A1 6/2021 Costa et al.
2021/0183693 A1 6/2021 Costa et al.
2021/0188624 A1 6/2021 Costa et al.
2021/0348078 A1 11/2021 Haramoto et al.
2022/0285205 A1 9/2022 Chetry et al.
2023/0387042 A1 11/2023 Costa et al.
2024/0030117 A1 1/2024 Costa et al.
2024/0030126 A1 1/2024 Costa

FOREIGN PATENT DOCUMENTS

CN 101785098 A 7/2010
CN 101901953 A 12/2010
CN 102084505 A 6/2011
CN 102422415 A 4/2012
CN 102543908 A 7/2012
CN 102956468 A 3/2013
CN 103000537 A 3/2013
CN 103383927 A 11/2013
CN 103681575 A 3/2014
CN 103730429 A 4/2014
CN 103811474 A 5/2014
CN 103872012 A 6/2014
CN 104134607 A 11/2014
CN 106057747 A 10/2016
CN 106098609 A 11/2016
CN 106158786 A 11/2016
CN 107481998 A 12/2017

(56) References Cited

FOREIGN PATENT DOCUMENTS

| | | | |
|---|---|---|---|
| CN | 108028225 | A | 5/2018 |
| CN | 110473841 | A | 11/2019 |
| DE | 102014117594 | A1 | 6/2016 |
| EP | 1098386 | A1 | 5/2001 |
| EP | 2862204 | A | 4/2015 |
| EP | 2996143 | A1 | 3/2016 |
| JP | S505733 | Y1 | 2/1975 |
| JP | S5338954 | A | 4/1978 |
| JP | H11-220077 | A | 8/1999 |
| JP | 200293957 | A | 3/2002 |
| JP | 2002252376 | A | 9/2002 |
| JP | 2002100767 | A | 10/2003 |
| JP | 2004273604 | A | 9/2004 |
| JP | 2004327557 | A | 11/2004 |
| JP | 2006005025 | A | 1/2006 |
| JP | 2007227439 | A | 9/2007 |
| JP | 2008235490 | A | 10/2008 |
| JP | 2008279567 | A | 11/2008 |
| JP | 2009026880 | A | 2/2009 |
| JP | 2009530823 | A | 8/2009 |
| JP | 2009200274 | A | 9/2009 |
| JP | 2009302526 | A | 12/2009 |
| JP | 2011216780 | A | 10/2011 |
| JP | 2011243596 | A | 12/2011 |
| JP | 2012129419 | A | 7/2012 |
| JP | 2012156251 | A | 8/2012 |
| JP | 2013162096 | A | 8/2013 |
| JP | 2013222745 | A | 10/2013 |
| JP | 2013254918 | A | 12/2013 |
| JP | 2014509448 | A | 4/2014 |
| TW | 201409612 | A | 3/2014 |
| TW | 201448172 | A | 12/2014 |
| TW | 201503315 | A | 1/2015 |
| TW | 201705382 | A | 2/2017 |
| TW | 201719827 | A | 6/2017 |
| TW | 201724310 | A | 7/2017 |
| TW | 201733056 | A | 9/2017 |
| TW | 201738943 | A | 11/2017 |
| TW | 201826332 | A | 7/2018 |
| TW | 201834084 | A | 9/2018 |
| TW | 201835971 | A | 10/2018 |
| TW | 201839858 | A | 11/2018 |
| TW | 201839870 | A | 11/2018 |
| WO | 2007074651 | A1 | 7/2007 |
| WO | 2010080068 | A1 | 7/2010 |
| WO | 2015074439 | A1 | 5/2015 |
| WO | 2018083961 | A1 | 5/2018 |
| WO | 2018125242 | A1 | 7/2018 |
| WO | 2018168391 | A1 | 9/2018 |
| WO | 2022125722 | A1 | 6/2022 |
| WO | 2022126016 | A2 | 6/2022 |

OTHER PUBLICATIONS

Notice of Allowance for U.S. Appl. No. 18/151,235, mailed May 29,2024, 22 pages.
Notice of Allowance for U.S. Appl. No. 17/102,957, mailed June 25, 2024, 11 pages.
Notice of Preliminary Rejection for Korean Patent Application No. 1020217026777, mailed Apr. 23, 2024, 15 pages.
Notice of Preliminary Rejection for Korean Patent Application No. 1020217026784, mailed May 28, 2024, 13 pages.
Notice of Preliminary Rejection for Korean Patent Application No. 1020217026776, mailed May 20, 2024, 4 pages.
Notice of Preliminary Rejection for Korean Patent Application No. 1020217026748, mailed May 22, 2024, 15 pages.
Notice of Preliminary Rejection for Korean Patent Application No. 1020217026781, mailed May 29, 2024, 13 pages.
Corrected Notice of Allowability for U.S. Appl. No. 17/102,957, mailed Jul. 10, 2024, 7 pages.
Notice of Allowance for Japanese Patent Application No. 2019507767, mailed Jan. 19, 2022, 6 pages.
Decision to Grant for Japanese Patent Application No. 2019507768, mailed Feb. 10, 2022, 6 pages.
Notice of Allowance for U.S. Appl. No. 17/306,194, mailed Aug. 24, 2023, 10 pages.
Notice of Allowance for U.S. Appl. No. 16/390,496, mailed Aug. 24, 2023, 24 pages.
Notice of Allowance for U.S. Appl. No. 17/970,078, mailed Aug. 25, 2023, 10 pages.
Applicant-Initiated Interview Summary for U.S. Appl. No. 16/678,551, mailed Aug. 22, 2023, 7 pages.
Quayle Action for U.S. Appl. No. 16/678,551, mailed Oct. 4, 2023, 6 pages.
Notice of Allowance for U.S. Appl. No. 16/678,551, mailed Dec. 7, 2023, 9 pages.
Non-Final Office Action for U.S. Appl. No. 16/678,602, mailed Oct. 6, 2023, 18 pages.
Applicant-Initiated Interview Summary for U.S. Appl. No. 16/844,406, mailed Sep. 13, 2023, 2 pages.
Final Office Action for U.S. Appl. No. 16/844,406, mailed Sep. 28, 2023, 7 pages.
Notice of Allowance for for U.S. Appl. No. 16/844,406, mailed, Nov. 16, 2023, 11 pages.
Final Office Action for U.S. Appl. No. 17/121,194, mailed Sep. 7, 2023, 24 pages.
Notice of Allowance for U.S. Appl. No. 17/121,194, mailed Oct. 23, 2023, 8 pages.
Final Office Action for U.S. Appl. No. 17/102,957, mailed Oct. 26, 2023, 27 pages.
Notice of Allowance for U.S. Appl. No. 17/389,977, mailed Aug. 16, 2023, 8 pages.
Corrected Notice of Allowability for U.S. Appl. No. 17/389,977, mailed Sep. 20, 2023, 5 pages.
Corrected Notice of Allowability for U.S. Appl. No. 17/389,977, mailed Oct. 25, 2023, 5 pages.
Corrected Notice of Allowability for U.S. Appl. No. 17/389,977, mailed Nov. 24, 2023, 5 pages.
Board Opinion for Chinese Patent Application No. 201780058052. 6, mailed Oct. 8, 2023, 15 pages.
First Office Action for Chinese Patent Application No. 201980050433. 9, mailed Sep. 4, 2023, 20 pages.
Office Action for Taiwanese Patent Application No. 108119536, mailed Nov. 24, 2023, 22 pages.
First Office Action for Chinese Patent Application No. 201980090320. 1, mailed Sep. 5, 2023, 11 pages.
First Office Action for Chinese Patent Application No. 201980077328. 4, mailed Aug. 28, 2023, 15 pages.
Second Office Action for Chinese Patent Application No. 201980079375. 2, mailed Nov. 21, 2023, 17 pages.
Notice of Preliminary Rejection for Korean Patent Application No. 1020217026777, mailed Jul. 28, 2023, 12 pages.
Office Action for Taiwanese Patent Application No. 109102892, mailed Sep. 13, 2023, 18 pages.
Preliminary Examination Report for Taiwanese Patent Application No. 109102893, mailed Sep. 7, 2023, 10 pages.
Office Action for Taiwanese Patent Application No. 109102895, mailed Nov. 30, 2023, 16 pages.
Supplemental Notice of Allowability for U.S. Appl. No. 17/306,194, mailed Apr. 2, 2024, 7 pages.
Notice of Allowance for U.S. Appl. No. 16/426,527, mailed Jan. 22, 2024, 10 pages.
Non-Final Office Action for U.S. Appl. No. 18/306,599, mailed Jan. 22, 2024, 11 pages.
Notice of Allowance for U.S. Appl. No. 18/306,599, mailed Apr. 10, 2024, 8 pages.
Notice of Allowance and Applicant-Initiated Interview Summary for U.S. Appl. No. 16/678,602, mailed Mar. 7, 2024, 14 pages.
Notice of Allowance for U.S. Appl. No. 17/389,977, mailed Jan. 18, 2024, 17 pages.
Board Opinion for Chinese Patent Application No. 201780058052. 6, mailed Jan. 15, 2024, 28 pages.
Preliminary Examination Report for Taiwanese Patent Application No. 108143149, mailed Oct. 18, 2023, 30 pages.

(56) References Cited

OTHER PUBLICATIONS

Reasons for Rejection for Taiwanese Patent Application No. 109102896, mailed Dec. 13, 2023, 17 pages.
Second Office Action for Chinese Patent Application No. 201980077328.4, mailed Mar. 29, 2024, 14 pages.
Notice of Allowance for U.S. Appl. No. 16/426,527, mailed Aug. 7, 2024, 9 pages.
Examination Report for Taiwanese Patent Application No. 109102896, mailed Jun. 27, 2024, 18 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology On SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

(56) References Cited

OTHER PUBLICATIONS

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Notice of Allowance for U.S. Appl. No. 16/204,214, mailed Oct. 28, 2022, 11 pages.
Final Office Action for U.S. Appl. No. 16/204,214, mailed Mar. 6, 2020, 14 pages.
Notice of Allowance for U.S. Appl. No. 16/390,496, mailed Oct. 27, 2022, 21 pages.
Notice of Allowance for U.S. Appl. No. 16/426,527, mailed Aug. 17, 2022, 7 pages.
Quayle Action for U.S. Appl. No. 16/426,527, mailed May 26, 2022, 5 pages.
Advisory Action for U.S. Appl. No. 16/427,019, mailed Jun. 2, 2022, 3 pages.
Non-Final Office Action for U.S. Appl. No. 16/427,019, mailed Aug. 15, 2022, 17 pages.
Final Office Action for U.S. Appl. No. 16/427,019, mailed Apr. 12, 2022, 15 pages.
Final Office Action for U.S. Appl. No. 16/427,019, mailed Dec. 12, 2022, 19 pages.
Corrected Notice of Allowability for U.S. Appl. No. 16/678,551, mailed Nov. 2, 2022, 3 pages.
Corrected Notice of Allowability for U.S. Appl. No. 16/678,551, mailed Mar. 9, 2022, 3 pages.
Corrected Notice of Allowability for U.S. Appl. No. 16/678,551, mailed Apr. 11, 2022, 3 pages.
Corrected Notice of Allowability for U.S. Appl. No. 16/678,551, mailed May 13, 2022, 3 pages.
Corrected Notice of Allowability for U.S. Appl. No. 16/678,551, mailed Jun. 15, 2022, 3 pages.
Corrected Notice of Allowability for U.S. Appl. No. 16/678,551, mailed Jul. 14, 2022, 3 pages.
Corrected Notice of Allowability for U.S. Appl. No. 16/678,551, mailed Sep. 2, 2022, 3 pages.
Corrected Notice of Allowability for U.S. Appl. No. 16/678,551, mailed Oct. 4, 2022, 3 pages.
Corrected Notice of Allowability for U.S. Appl. No. 16/678,602, mailed Apr. 8, 2022, 4 pages.
Corrected Notice of Allowability for U.S. Appl. No. 16/678,551, mailed Dec. 7, 2022, 3 pages.
Corrected Notice of Allowability for U.S. Appl. No. 16/678,573, mailed Jan. 27, 2022, 3 pages.
Corrected Notice of Allowability for U.S. Appl. No. 16/678,573, mailed Mar. 31, 2022, 3 pages.
Corrected Notice of Allowability for U.S. Appl. No. 16/678,573, mailed May 6, 2022, 3 pages.
Corrected Notice of Allowability for U.S. Appl. No. 16/678,573, mailed Jun. 10, 2022, 3 pages.
Advisory Action for U.S. Appl. No. 16/678,586, mailed Jan. 26, 2022, 3 pages.
Notice of Allowance and Examiner-Initiated Interview Summary for U.S. Appl. No. 16/678,586, mailed Sep. 13, 2022, 11 pages.
Non-Final Office Action for U.S. Appl. No. 16/678,586, mailed Mar. 3, 2022, 14 pages.
Final Office Action for U.S. Appl. No. 16/678,586, mailed Sep. 1, 2022, 7 pages.
Final Office Action for U.S. Appl. No. 16/678,586, mailed Nov. 22, 2021, 15 pages.
Corrected Notice of Allowability for U.S. Appl. No. 16/678,602, mailed Feb. 2, 2022, 4 pages.
Corrected Notice of Allowability for U.S. Appl. No. 16/678,602, mailed Mar. 9, 2022, 4 pages.
Corrected Notice of Allowability for U.S. Appl. No. 16/678,602, mailed May 13, 2022, 4 pages.
Corrected Notice of Allowability for U.S. Appl. No. 16/678,602, mailed Jun. 10, 2022, 4 pages.
Corrected Notice of Allowability for U.S. Appl. No. 16/678,602, mailed Jul. 14, 2022, 4 pages.
Corrected Notice of Allowability for U.S. Appl. No. 16/678,602, mailed Sep. 2, 2022, 4 pages.
Corrected Notice of Allowability for U.S. Appl. No. 16/678,602, mailed Oct. 5, 2022, 4 pages.
Corrected Notice of Allowability for U.S. Appl. No. 16/678,602, mailed Nov. 14, 2022, 4 pages.
Corrected Notice of Allowability for U.S. Appl. No. 16/678,602, mailed Nov. 24, 2021, 4 pages.
Corrected Notice of Allowability for U.S. Appl. No. 16/678,602, mailed Dec. 9, 2022, 4 pages.
Corrected Notice of Allowability for U.S. Appl. No. 16/678,602, mailed Dec. 30, 2021, 4 pages.
Non-Final Office Action for U.S. Appl. No. 16/844,406, mailed Mar. 14, 2022, 16 pages.
Non-Final Office Action for U.S. Appl. No. 17/102,957, mailed Feb. 17, 2022, 9 pages.
Notice of Allowance for U.S. Appl. No. 17/330,787, mailed Dec. 15, 2022, 7 pages.
Non-Final Office Action for U.S. Appl. No. 17/330,787, mailed Oct. 17, 2022, 10 pages.
Non-Final Office Action for U.S. Appl. No. 17/554,477, mailed Nov. 25, 2022, 6 pages.
Non-Final Office Action for U.S. Appl. No. 17/573,112, mailed Dec. 9, 2022, 6 pages.
Decision of Rejection for Chinese Patent Application No. 201680058198.6, mailed Nov. 12, 2021, 6 pages.
Summons to Attend for European Patent Application No. 16751791.1, mailed Feb. 28, 2022, 10 pages.
Examination Report for European Patent Application No. 17755402.9, mailed Dec. 20, 2021, 12 pages.
Examination Report for European Patent Application No. 17755403.7, mailed Dec. 20, 2021, 13 pages.
Reasons for Rejection for Japanese Patent Application No. 2019507767, mailed Jun. 25, 2021, 5 pages.
Notice of Allowance for Taiwanese Patent Application No. 108119536, mailed Apr. 30, 2024, 4 pages.
Office Action for Taiwanese Patent Application No. 113110397, mailed May 7, 2024, 10 pages.
Notice of Preliminary Rejection for Korean Patent Application No. 1020217026747, mailed May 1, 2024, 5 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.

(56) References Cited

OTHER PUBLICATIONS

Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Applicant-Initiated Interview Summary for U.S. Appl. No. 13/852,648, mailed Jan. 27, 2014, 4 pages.
Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Final Office Action for U.S. Appl. No. 13/852,648, mailed Oct. 22, 2015, 20 pages.
Non-Final Office Action for U.S. Appl. No. 13/852,648, mailed Feb. 19, 2016, 12 pages.
Final Office Action for U.S. Appl. No. 13/852,648, mailed Jul. 20, 2016, 14 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/261,029, mailed Dec. 5, 2014, 15 pages.
Notice of Allowance for U.S. Appl. No. 14/261,029, mailed Apr. 27, 2015, 10 pages.
Corrected Notice of Allowability for U.S. Appl. No. 14/261,029, mailed Nov. 17, 2015, 5 pages.
Non-Final Office Action for U.S. Appl. No. 14/529,870, mailed Feb. 12, 2016, 14 pages.
Notice of Allowance for U.S. Appl. No. 14/529,870, mailed Jul. 15, 2016, 8 pages.
Non-Final Office Action for U.S. Appl. No. 15/293,947, mailed Apr. 7, 2017, 12 pages.
Notice of Allowance for U.S. Appl. No. 15/293,947, mailed Aug. 14, 2017, 7 pages.
Non-Final Office Action for U.S. Appl. No. 14/715,830, mailed Apr. 13, 2016, 16 pages.
Final Office Action for U.S. Appl. No. 14/715,830, mailed Sep. 6, 2016, 13 pages.
Advisory Action for U.S. Appl. No. 14/715,830, mailed Oct. 31, 2016, 6 pages.
Notice of Allowance for U.S. Appl. No. 14/715,830, mailed Feb. 10, 2017, 8 pages.
Notice of Allowance for U.S. Appl. No. 14/715,830, mailed Mar. 2, 2017, 8 pages.
Non-Final Office Action for U.S. Appl. No. 14/851,652, mailed Oct. 7, 2016, 10 pages.
Notice of Allowance for U.S. Appl. No. 14/851,652, mailed Apr. 11, 2017, 9 pages.
Corrected Notice of Allowance for U.S. Appl. No. 14/851,652, mailed Jul. 24, 2017, 6 pages.
Corrected Notice of Allowance for U.S. Appl. No. 14/851,652, mailed Sep. 6, 2017, 5 pages.
Notice of Allowance for U.S. Appl. No. 14/959,129, mailed Oct. 11, 2016, 8 pages.
Non-Final Office Action for U.S. Appl. No. 15/173,037, mailed Jan. 10, 2017, 8 pages.
Final Office Action for U.S. Appl. No. 15/173,037, mailed May 2, 2017, 13 pages.
Advisory Action for U.S. Appl. No. 15/173,037, mailed Jul. 20, 2017, 3 pages.
Notice of Allowance for U.S. Appl. No. 15/173,037, mailed Aug. 9, 2017, 7 pages.
Non-Final Office Action for U.S. Appl. No. 15/085,185, mailed Feb. 15, 2017, 10 pages.
Non-Final Office Action for U.S. Appl. No. 15/085,185, mailed Jun. 6, 2017, 5 pages.
Non-Final Office Action for U.S. Appl. No. 15/229,780, mailed Jun. 30, 2017, 12 pages.
Non-Final Office Action for U.S. Appl. No. 15/262,457, mailed Aug. 7, 2017, 10 pages.
Notice of Allowance for U.S. Appl. No. 15/408,560, mailed Sep. 25, 2017, 8 pages.
Notice of Allowance for U.S. Appl. No. 15/287,202, mailed Aug. 25, 2017, 11 pages.
Non-Final Office Action for U.S. Appl. No. 15/353,346, mailed May 23, 2017, 15 pages.
Notice of Allowance for U.S. Appl. No. 15/353,346, mailed Sep. 25, 2017, 9 pages.
Preliminary Examination Report for Taiwanese Patent Application No. 108143149, mailed May 15, 2024, 20 pages.
Non-Final Office Action for U.S. Appl. No. 15/676,693, mailed May 3, 2018, 14 pages.
Notice of Allowance for U.S. Appl. No. 15/789,107, mailed May 18, 2018, 8 pages.
Final Office Action for U.S. Appl. No. 15/616,109, mailed Apr. 19, 2018, 18 pages.
Notice of Allowance for U.S. Appl. No. 15/676,693, mailed Jul. 20, 2018, 8 pages.
Notice of Allowance for U.S. Appl. No. 15/695,629, mailed Jul. 11, 2018, 12 pages.
Notice of Allowance for U.S. Appl. No. 15/387,855, mailed Aug. 10, 2018, 7 pages.
Notice of Allowance for U.S. Appl. No. 15/914,538, mailed Aug. 1, 2018, 9 pages.
Notice of Allowance and Applicant-Initiated Interview Summary for U.S. Appl. No. 15/262,457, mailed Sep. 28, 2018, 16 pages.
Corrected Notice of Allowance for U.S. Appl. No. 15/676,693, mailed Aug. 29, 2018, 5 pages.
Final Office Action for U.S. Appl. No. 15/601,858, mailed Nov. 26, 2018, 16 pages.
Non-Final Office Action for U.S. Appl. No. 15/945,418, mailed Nov. 1, 2018, 13 pages.
First Office Action for Chinese Patent Application No. 201510746323.X, mailed Nov. 2, 2018, 12 pages.
Advisory Action for U.S. Appl. No. 15/601,858, mailed Jan. 22, 2019, 3 pages.
Notice of Allowance for U.S. Appl. No. 16/038,879, mailed Jan. 9, 2019, 8 pages.
Notice of Allowance for U.S. Appl. No. 16/004,961, mailed Jan. 11, 2019, 8 pages.
International Preliminary Report on Patentability for PCT/US2017/046744, mailed Feb. 21, 2019, 11 pages.
International Preliminary Report on Patentability for PCT/US2017/046758, mailed Feb. 21, 2019, 11 pages.
International Preliminary Report on Patentability for PCT/US2017/046779, mailed Feb. 21, 2019, 11 pages.

(56) References Cited

OTHER PUBLICATIONS

Non-Final Office Action for U.S. Appl. No. 15/992,613, mailed Feb. 27, 2019, 15 pages.
Non-Final Office Action for U.S. Appl. No. 15/695,579, mailed Jan. 28, 2019, 8 pages.
Notice of Allowance for U.S. Appl. No. 15/992,639, mailed May 9, 2019, 7 pages.
Notice of Allowance for U.S. Appl. No. 15/695,579, mailed Mar. 20, 2019, 8 pages.
Notice of Allowance for U.S. Appl. No. 16/004,961, mailed May 13, 2019, 8 pages.
Non-Final Office Action for U.S. Appl. No. 15/601,858, mailed Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, mailed May 24, 2019, 11 pages.
Non-Final Office Action for U.S. Appl. No. 15/873,152, mailed May 24, 2019, 11 pages.
Notice of Allowance for U.S. Appl. No. 16/168,327, mailed Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, mailed Jun. 21, 2019, 7 pages.
Notice of Reasons for Refusal for Japanese Patent Application No. 2015-180657, mailed Jul. 9, 2019, 4 pages.
Notice of Allowance for U.S. Appl. No. 15/601,858, mailed Aug. 16, 2019, 8 pages.
Advisory Action for U.S. Appl. No. 15/992,613, mailed Jul. 29, 2019, 3 pages.
Final Office Action for U.S. Appl. No. 15/873,152, mailed Aug. 8, 2019, 13 pages.
Notice of Allowance for U.S. Appl. No. 15/975,230, mailed Jul. 22, 2019, 7 pages.
Notice of Allowance for U.S. Appl. No. 16/004,961, mailed Aug. 28, 2019, 8 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, mailed Feb. 5, 2020, 5 pages.
Notice of Allowance for U.S. Appl. No. 15/992,613, mailed Sep. 23, 2019, 7 pages.
Non-Final Office Action for U.S. Appl. No. 16/204,214, mailed Oct. 9, 2019, 15 pages.
Non-Final Office Action for U.S. Appl. No. 15/816,637, mailed Oct. 31, 2019, 10 pages.
Advisory Action for U.S. Appl. No. 15/873,152, mailed Oct. 11, 2019, 3 pages.
Notice of Allowance for U.S. Appl. No. 15/873,152, mailed Dec. 10, 2019, 9 pages.
Non-Final Office Action for U.S. Appl. No. 16/527,702, mailed Jan. 10, 2020, 10 pages.
Office Action for Japanese Patent Application No. 2018-526613, mailed Nov. 5, 2019, 8 pages.
Intention to Grant for European Patent Application No. 17757646.9, mailed Feb. 27, 2020, 55 pages.
International Search Report and Written Opinion for International Patent Application No. PCT/US2019/034645, mailed Sep. 19, 2019, 14 pages.
International Search Report and Written Opinion for International Patent Application No. PCT/US2019/063460, mailed Feb. 25, 2020, 14 pages.
International Search Report and Written Opinion for International Patent Application No. PCT/US2019/055317, mailed Feb. 6, 2020, 17 pages.
International Search Report and Written Opinion for International Patent Application No. PCT/US2019/055321, mailed Jan. 27, 2020, 23 pages.
International Search Report and Written Opinion for International Patent Application No. PCT/US2019/034699, mailed Oct. 29, 2019, 13 pages.
Corrected Notice of Allowability for U.S. Appl. No. 15/695,579, mailed Apr. 1, 2020, 4 pages.
Notice of Allowance for U.S. Appl. No. 15/816,637, mailed Apr. 2, 2020, 8 pages.
Notice of Allowance for U.S. Appl. No. 16/527,702, mailed Apr. 9, 2020, 8 pages.
Decision of Rejection for Japanese Patent Application No. 2015-180657, mailed Mar. 17, 2020, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, mailed Apr. 15, 2020, 9 pages.
Notice of Allowance for U.S. Appl. No. 16/004,961, mailed Apr. 30, 2020, 8 pages.
Advisory Action for U.S. Appl. No. 16/204,214, mailed Apr. 15, 2020, 3 pages.
Examination Report for European Patent Application No. 16751791.1, mailed Apr. 30, 2020, 15 pages.
Notification of Reasons for Refusal for Japanese Patent Application No. 2018-526613, mailed May 11, 2020, 5 pages.
Notice of Allowance for U.S. Appl. No. 15/873,152, mailed May 11, 2020, 8 pages.
Non-Final Office Action for U.S. Appl. No. 16/454,687, mailed May 15, 2020, 14 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Zeng, X. et al., "A Combination of Boron Nitride Nanotubes and Cellulose Nanofibers for the Preparation of a Nanocomposite with High Thermal Conductivity," ACS Nano, vol. 11, No. 5, 2017, American Chemical Society, pp. 5167-5178.
Quayle Action for U.S. Appl. No. 16/703,251, mailed Jun. 26, 2020, 5 pages.
Corrected Notice of Allowability for U.S. Appl. No. 15/695,579, mailed May 20, 2020, 4 pages.
Notice of Allowability for U.S. Appl. No. 15/695,579, mailed Jun. 25, 2020, 4 pages.
Notice of Allowance for U.S. Appl. No. 16/368,210, mailed Jun. 17, 2020, 10 pages.

(56) References Cited

OTHER PUBLICATIONS

Non-Final Office Action for U.S. Appl. No. 16/374,125, mailed Jun. 26, 2020, 12 pages.
Non-Final Office Action for U.S. Appl. No. 16/390,496, mailed Jul. 10, 2020, 17 pages.
Non-Final Office Action for U.S. Appl. No. 16/204,214, mailed May 19, 2020, 15 pages.
Non-Final Office Action for U.S. Appl. No. 16/454,809, mailed May 15, 2020, 12 pages.
Examination Report for Singapore Patent Application No. 11201901193U, mailed May 26, 2020, 6 pages.
International Search Report and Written Opinion for International Patent Application No. PCT/US2020/014662, mailed May 7, 2020, 18 pages.
International Search Report and Written Opinion for International Patent Application No. PCT/US2020/014665, mailed May 13, 2020, 17 pages.
International Search Report and Written Opinion for International Patent Application No. PCT/US2020/014666, mailed Jun. 4, 2020, 18 pages.
International Search Report and Written Opinion for International Patent Application No. PCT/US2020/014667, mailed May 18, 2020, 14 pages.
International Search Report and Written Opinion for International Patent Application No. PCT/US2020/014669, mailed Jun. 4, 2020, 15 pages.
Notice of Allowance for U.S. Appl. No. 16/454,687, mailed Aug. 14, 2020, 7 pages.
Decision to Grant for Japanese Patent Application No. 2018-526613, mailed Aug. 17, 2020, 5 pages.
Final Office Action for U.S. Appl. No. 16/454,809, mailed Aug. 21, 2020, 12 pages.
Von Trapp, F., "Hybrid Bonding: From Concept to Commercialization," Apr. 2, 2018, 3D InCities, https://www.3dincites.com/2018/04/hybrid-bonding-from-concept-to-commercialization/, 10 pages.
Notice of Allowance for U.S. Appl. No. 16/703,251, mailed Aug. 27, 2020, 8 pages.
Notice of Allowance for U.S. Appl. No. 16/527,702, mailed Nov. 13, 2020, 8 pages.
Notice of Allowance for U.S. Appl. No. 16/374,125, mailed Dec. 16, 2020, 9 pages.
Final Office Action for U.S. Appl. No. 16/390,496, mailed Dec. 24, 2020, 21 pages.
Non-Final Office Action for U.S. Appl. No. 16/426,527, mailed Nov. 20, 2020, 7 pages.
Final Office Action for U.S. Appl. No. 16/204,214, mailed Nov. 30, 2020, 15 pages.
Notice of Allowance for U.S. Appl. No. 16/204,214, mailed Feb. 17, 2021, 11 pages.
Advisory Action for U.S. Appl. No. 16/454,809, mailed Oct. 23, 2020, 3 pages.
Notice of Allowance for U.S. Appl. No. 15/287,273, mailed Jun. 30, 2017, 8 pages.
Corrected Notice of Allowability for U.S. Appl. No. 15/287,273, mailed Jul. 21, 2017, 5 pages.
Supplemental Notice of Allowability for U.S. Appl. No. 15/287,273, mailed Sep. 7, 2017, 5 pages.
Extended European Search Report for European Patent Application No. 15184861.1, mailed Jan. 25, 2016, 6 pages.
Office Action of the Intellectual Property Office for Taiwanese Patent Application No. 104130224, mailed Jun. 15, 2016, 9 pages.
Non-Final Office Action for U.S. Appl. No. 14/885,202, mailed Apr. 14, 2016, 5 pages.
Final Office Action for U.S. Appl. No. 14/885,202, mailed Sep. 27, 2016, 7 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.
Notice of Allowance for U.S. Appl. No. 14/885,202, mailed Jul. 24, 2017, 8 pages.
Notice of Allowance for U.S. Appl. No. 14/885,243, mailed Aug. 31, 2016, 8 pages.
Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, mailed Oct. 7, 2016, 11 pages.
Non-Final Office Action for U.S. Appl. No. 15/652,867, mailed Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, mailed Nov. 27, 2017, 17 pages.
International Search Report and Written Opinion for PCT/US2017/046758, mailed Nov. 16, 2017, 19 pages.
International Search Report and Written Opinion for PCT/US2017/046779, mailed Nov. 29, 2017, 17 pages.
Non-Final Office Action for U.S. Appl. No. 15/616,109, mailed Oct. 23, 2017, 16 pages.
Corrected Notice of Allowability for U.S. Appl. No. 14/851,652, mailed Oct. 20, 2017, 5 pages.
Final Office Action for U.S. Appl. No. 15/262,457, mailed Dec. 19, 2017, 12 pages.
Supplemental Notice of Allowability and Applicant-Initiated Interview Summary for U.S. Appl. No. 15/287,273, mailed Oct. 18, 2017, 6 pages.
Supplemental Notice of Allowability for U.S. Appl. No. 15/287,273, mailed Nov. 2, 2017, 5 pages.
Non-Final Office Action for U.S. Appl. No. 15/491,064, mailed Jan. 2, 2018, 9 pages.
Notice of Allowance for U.S. Appl. No. 14/872,910, mailed Nov. 17, 2017, 11 pages.
Notice of Allowance for U.S. Appl. No. 15/648,082, mailed Nov. 29, 2017, 8 pages.
Non-Final Office Action for U.S. Appl. No. 15/652,826, mailed Nov. 3, 2017, 5 pages.
Notice of Allowance for U.S. Appl. No. 15/229,780, mailed Oct. 3, 2017, 7 pages.
Supplemental Notice of Allowability for U.S. Appl. No. 15/287,273, mailed Jan. 17, 2018, 5 pages.
Notice of Allowance for U.S. Appl. No. 15/498,040, mailed Feb. 20, 2018, 8 pages.
Non-Final Office Action for U.S. Appl. No. 15/387,855, mailed Jan. 16, 2018, 7 pages.
Non-Final Office Action for U.S. Appl. No. 15/795,915, mailed Feb. 23, 2018, 6 pages.
International Preliminary Report on Patentability for PCT/US2016/045809, mailed Feb. 22, 2018, 8 pages.
Advisory Action and Applicant-Initiated Interview Summary for U.S. Appl. No. 15/262,457, mailed Feb. 28, 2018, 5 pages.
Supplemental Notice of Allowability for U.S. Appl. No. 15/287,273, mailed Feb. 23, 2018, 5 pages.
Non-Final Office Action for U.S. Appl. No. 15/676,415, mailed Mar. 27, 2018, 14 page.
Non-Final Office Action for U.S. Appl. No. 15/676,621, mailed Mar. 26, 2018, 16 pages.

(56) References Cited

OTHER PUBLICATIONS

Notice of Allowance for U.S. Appl. No. 15/795,915, mailed Jun. 15, 2018, 7 pages.
Final Office Action for U.S. Appl. No. 15/387,855, mailed May 24, 2018, 9 pages.
Non-Final Office Action for U.S. Appl. No. 15/262,457, mailed Apr. 19, 2018, 10 pages.
Notice of Allowance for U.S. Appl. No. 15/491,064, mailed Apr. 30, 2018, 9 pages.
Non-Final Office Action for U.S. Appl. No. 15/601,858, mailed Jun. 26, 2018, 12 pages.
Notice of Allowance for U.S. Appl. No. 15/616,109, mailed Jul. 2, 2018, 7 pages.
Notice of Allowance for U.S. Appl. No. 15/676,621, mailed Jun. 5, 2018, 8 pages.
Final Office Action for U.S. Appl. No. 16/844,406, mailed Jun. 24, 2022, 17 pages.
Advisory Action for U.S. Appl. No. 16/844,406, mailed Jul. 26, 2022, 3 pages.
Non-Final Office Action for U.S. Appl. No. 16/844,406, mailed Oct. 6, 2022, 17 pages.
Notice of Allowance for U.S. Appl. No. 17/109,935, mailed Apr. 20, 2022, 15 pages.
Corrected Notice of Allowability U.S. Appl. No. 17/109,935, mailed Jul. 1, 2022, 4 pages.
Corrected Notice of Allowability U.S. Appl. No. 17/109,935, mailed Jul. 27, 2022, 4 pages.
Corrected Notice of Allowability U.S. Appl. No. 17/109,935, mailed Sep. 14, 2022, 4 pages.
Notice of Allowance for U.S. Appl. No. 17/109,935, mailed Oct. 28, 2022, 7 pages.
Corrected Notice of Allowability for U.S. Appl. No. 17/109,935, mailed Nov. 10, 2022, 4 pages.
Corrected Notice of Allowability for U.S. Appl. No. 17/109,935, mailed Jan. 10, 2023, 4 pages.
Final Office Action for U.S. Appl. No. 17/102,957, mailed Aug. 18, 2022, 12 pages.
Advisory Action for U.S. Appl. No. 17/102,957, mailed Oct. 27, 2022, 7 pages.
Notice of Preliminary Rejection for Korean Patent Application No. 10-2018-7006660, mailed Sep. 3, 2022, 6 pages.
First Office Action for Chinese Patent Application No. 201780062516.0, mailed Nov. 2, 2022, 10 pages.
First Office Action for Chinese Patent Application No. 201780063121.2, mailed Nov. 23, 2022, 12 pages.
Notice of Reasons for Rejection for Japanese Patent Application No. 2022032477, mailed Oct. 3, 2022, 4 pages.
First Office Action for Chinese Patent Application No. 201780058052.6, mailed Nov. 2, 2022, 22 pages.
International Search Report and Written Opinion for International Patent Application No. PCT/US2021/063093, mailed May 4, 2022, 15 pages.
Invitation to Pay Additional Fees and Partial International Search for International Patent Application No. PCT/US2021/063094, mailed Apr. 19, 2022, 15 pages.
International Search Report and Written Opinion for International Patent Application No. PCT/US2021/063094, mailed Aug. 9, 2022, 24 pages.
International Search Report and Written Opinion for International Patent Application No. PCT/US2021/062509, mailed Mar. 29, 2022, 20 pages.
Non-Final Office Action for U.S. Appl. No. 16/426,527, mailed Feb. 9, 2023, 9 pages.
Final Office Action for U.S. Appl. No. 16/426,527, mailed May 25, 2023, 9 pages.
Notice of Allowance for U.S. Appl. No. 16/426,527, mailed Jun. 22, 2023, 8 pages.
Notice of Allowance for U.S. Appl. No. 16/427,019, mailed Mar. 10, 2023, 10 pages.
Non-Final Office Action for U.S. Appl. No. 16/678,551, mailed Mar. 28, 2023, 14 pages.
Final Office Action for U.S. Appl. No. 16/678,551, mailed May 26, 2023, 16 pages.
Notice of Allowance for U.S. Appl. No. 17/573,112, mailed Mar. 8, 2023, 8 pages.
Notice of Allowance for U.S. Appl. No. 17/554,477, mailed Mar. 7, 2023, 8 pages.
Final Office Action for U.S. Appl. No. 16/844,406, mailed Mar. 6, 2023, 13 pages.
Advisory Action for U.S. Appl. No. 16/844,406, mailed May 12, 2023, 3 pages.
Non-Final Office Action for U.S. Appl. No. 16/844,406, mailed Jun. 23, 2023, 18 pages.
Corrected Notice of Allowability for U.S. Appl. No. 17/109,935, mailed Mar. 1, 2023, 4 pages.
Corrected Notice of Allowability for U.S. Appl. No. 17/109,935, mailed Apr. 12, 2023, 4 pages.
Non-Final Office Action for U.S. Appl. No. 17/121,194, mailed May 9, 2023, 22 pages.
Non-Final Office Action for U.S. Appl. No. 17/102,957, mailed Apr. 13, 2023, 24 pages.
Non-Final Office Action for U.S. Appl. No. 17/389,977, mailed Mar. 28, 2023, 10 pages.
Written Decision on Registration for Korean Patent Application No. 10-2018-7006660, mailed Feb. 24, 2023, 8 pages.
Decision to Grant for Japanese Patent Application No. 2022032477, mailed Mar. 14, 2023, 5 pages.
Decision of Rejection for Chinese Patent Application No. 201780058052.6, mailed Mar. 30, 2023, 16 pages.
Preliminary Examination Report for Taiwanese Patent Application No. 108140788, mailed Dec. 9, 2022, 13 pages.
Office Action for Taiwanese Patent Application No. 109102892, mailed Apr. 14, 2023, 18 pages.
Preliminary Examination Report for Taiwanese Patent Application No. 109102895, mailed May 30, 2023, 18 pages.
Preliminary Examination Report for Tawainese Patent Application No. 109102896, mailed Jul. 4, 2023, 19 pages.
Advisory Action for U.S. Appl. No. 16/678,551, mailed Jul. 28, 2023, 3 pages.
Office Action for Taiwanese Patent Application No. 108119536, mailed Jul. 13, 2023, 6 pages.
First Office Action for Chinese Patent Application No. 201980079375.2, mailed May 5, 2023, 17 pages.
Preliminary Examination Report for Taiwanese Patent Application No. 109102894, mailed Apr. 7, 2023, 20 pages.
Office Letter for Taiwanese Patent Application No. 108140788, mailed Jan. 5, 2022, 16 pages.
International Search Report and Written Opinion for International Patent Application No. PCT/US2021/043968, mailed Nov. 19, 2021, 15 pages.
Notice of Allowance for U.S. Appl. No. 16/454,809, mailed Nov. 25, 2020, 8 pages.
Non-Final Office Action for U.S. Appl. No. 16/427,019, mailed Nov. 19, 2020, 19 pages.
Non-Final Office Action for U.S. Appl. No. 16/678,573, mailed Feb. 19, 2021, 11 pages.
Non-Final Office Action for U.S. Appl. No. 16/678,602, mailed Feb. 19, 2021, 10 pages.
First Office Action for Chinese Patent Application No. 201680058198.6, mailed Dec. 29, 2020, 14 pages.
International Preliminary Report on Patentability for International Patent Application No. PCT/US2019/025591, mailed Oct. 15, 2020, 6 pages.
International Preliminary Report on Patentability for International Patent Application No. PCT/US2019/034645, mailed Jan. 14, 2021, 9 pages.
Advisory Action for U.S. Appl. No. 16/390,496, mailed Mar. 1, 2021, 3 pages.
Notice of Allowance for U.S. Appl. No. 16/390,496, mailed Apr. 5, 2021, 7 pages.
Notice of Allowance for U.S. Appl. No. 16/426,527, mailed May 14, 2021, 9 pages.

(56) References Cited

OTHER PUBLICATIONS

Final Office Action for U.S. Appl. No. 16/427,019, mailed May 21, 2021, 16 pages.
Non-Final Office Action for U.S. Appl. No. 16/678,551, mailed Apr. 7, 2021, 9 pages.
Final Office Action and Examiner-Initiated Interview Summary for U.S. Appl. No. 16/678,551, mailed Jun. 28, 2021, 9 pages.
Applicant-Initiated Interview Summary for U.S. Appl. No. 16/678,573, mailed May 7, 2021, 2 pages.
Final Office Action and Examiner-Initiated Interview Summary for U.S. Appl. No. 16/678,573, mailed Jun. 28, 2021, 10 pages.
Notice of Allowance for U.S. Appl. No. 16/678,619, mailed Jul. 8, 2021, 10 pages.
Final Office Action for U.S. Appl. No. 16/678,602, mailed Jun. 1, 2021, 9 pages.
Notice of Reasons for Refusal for Japanese Patent Application No. 2020119130, mailed Jun. 29, 2021, 4 pages.
Notice of Reasons for Rejection for Japanese Patent Application No. 2019507765, mailed Jun. 28, 2021, 4 pages.
Search Report for Japanese Patent Application No. 2019507768, mailed Jul. 15, 2021, 42 pages.
Notice of Reasons for Refusal for Japanese Patent Application No. 2019507768, mailed Jul. 26, 2021, 4 pages.
Supplementary Examination Report for Singapore Patent Application No. 11201901194S, mailed Mar. 10, 2021, 3 pages.
International Preliminary Report on Patentability for International Patent Application No. PCT/US2019/063460, mailed Jun. 10, 2021, 9 pages.
International Preliminary Report on Patentability for International Patent Application No. PCT/US2019/055317, mailed Apr. 22, 2021, 11 pages.
International Preliminary Report on Patentability for International Patent Application No. PCT/US2019/055321, mailed Apr. 22, 2021, 14 pages.
Office Action for Taiwanese Patent Application No. 108140788, mailed Mar. 25, 2021, 18 pages.
Corrected Notice of Allowability for U.S. Appl. No. 16/426,527, mailed Aug. 18, 2021, 4 pages.
Advisory Action for U.S. Appl. No. 16/427,019, mailed Aug. 2, 2021, 3 pages.
Non-Final Office Action for U.S. Appl. No. 16/678,586, mailed Aug. 12, 2021, 16 pages.
Notice of Allowance and Examiner-Initiated Interview Summary for U.S. Appl. No. 16/678,602, mailed Aug. 12, 2021, 11 pages.
International Preliminary Report on Patentability for International Patent Application No. PCT/US2019/034699, mailed Aug. 5, 2021, 9 pages.
International Preliminary Report on Patentability for International Patent Application No. PCT/US2020/014662, mailed Aug. 5, 2021, 11 pages.
International Preliminary Report on Patentability for International Patent Application No. PCT/US2020/014665, mailed Aug. 5, 2021, 10 pages.
International Preliminary Report on Patentability for International Patent Application No. PCT/US2020/014666, mailed Aug. 5, 2021, 11 pages.
International Preliminary Report on Patentability for International Patent Application No. PCT/US2020/014667, mailed Aug. 5, 2021, 8 pages.
International Preliminary Report on Patentability for International Patent Application No. PCT/US2020/014669, mailed Aug. 5, 2021, 9 pages.
Advisory Action and Examiner-Initiated Interview Summary for U.S. Appl. No. 16/678,551, mailed Sep. 13, 2021, 3 pages.
Notice of Allowance and Examiner-Initiated Interview Summary for U.S. Appl. No. 16/678,551, mailed Oct. 21, 2021, 8 pages.
Advisory Action and Examiner-Initiated Interview Summary for U.S. Appl. No. 16/678,573, mailed Sep. 10, 2021, 3 pages.
Notice of Allowance and Examiner-Initiated Interview Summary for U.S. Appl. No. 16/678,573, mailed Oct. 21, 2021, 7 pages.
Corrected Notice of Allowability for U.S. Appl. No. 16/678,602, mailed Aug. 26, 2021, 4 pages.
Decision to Grant for Japanese Patent Application No. 2020119130, mailed Sep. 7, 2021, 4 pages.
Second Office Action for Chinese Patent Application No. 201680058198.6, mailed Sep. 8, 2021, 8 pages.
Borel, S. et al., "Control of Selectivity between SiGe and Si in Isotropic Etching Processes," Japanese Journal of Applied Physics, vol. 43, No. 6B, 2004, pp. 3964-3966.
Non-Final Office Action for U.S. Appl. No. 16/426,527, mailed Feb. 16, 2022, 9 pages.
Non-Final Office Action for U.S. Appl. No. 16/427,019, mailed Dec. 2, 2021, 17 pages.
Corrected Notice of Allowability for U.S. Appl. No. 16/678,551, mailed Nov. 24, 2021, 3 pages.
Corrected Notice of Allowability for U.S. Appl. No. 16/678,551, mailed Jan. 27, 2022, 3 pages.
Corrected Notice of Allowability for U.S. Appl. No. 16/678,573, mailed Nov. 24, 2021, 3 pages.
Non-Final Office Action for U.S. Appl. No. 18/071,053, mailed Oct. 24, 2024, 8 pages.
Written Decision on Registration for Korean Patent Application No. 10-2021-7026777, mailed Dec. 2, 2024, 7 pages.
Office Action for Taiwanese Patent Application No. 112147727, mailed Oct. 21, 2024, 10 pages.
Office Action for Taiwanese Patent Application No. 113125663, mailed Oct. 29, 2024, 11 pages.

* cited by examiner 62
68
70
66
64

62
68
66
70
64

62
68
66
64

72
68
14
20
26
22
44
24(64I)
42
50
30
66I
32
70I
28
34
40
38
36
52

66
70

14
20
22
26
24(64I)
44
78
74
42
50
52
30
32
34
46
28
36
38
40
48
76

78
14
20
22
15
26
52
74
44
24(64I)
42
30
50
48
32
46
38
40
34
36
28
76

79(17 and 80)
17

81
17
44
15
20
14
12
26
22
52
74
24(64I)
42
50
30
48
32
46
34
28
38
40
36
76
(64I)24
16

84
12
14
60
17
15
16
20
22
52
44
42
24(64I)
30
34
32
38
40
36
46
28
48
50
26
54

RF DEVICES WITH NANOTUBE PARTICLES FOR ENHANCED PERFORMANCE AND METHODS OF FORMING THE SAME

RELATED APPLICATIONS

This application is a continuation of U.S. patent application Ser. No. 16/844,406, now U.S. Pat. No. 12,074,086, which claims the benefit of provisional patent application Ser. No. 62/929,530, filed Nov. 1, 2019, the disclosures of which are hereby incorporated herein by reference in their entireties.

FIELD OF THE DISCLOSURE

The present disclosure relates to a radio frequency (RF) device and a process for making the same, and more particularly to an RF device with nanotube particles for enhanced thermal and electrical performance, and a wafer-level fabricating and packaging process to provide the RF device.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low costs of silicon materials, a large scale capacity of wafer production, well-established semiconductor design tools, and well-established semiconductor manufacturing techniques. Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates.

In addition, high speed and high performance transistors are more densely integrated in RF devices. Consequently, the amount of heat generated by the RF devices will increase significantly due to the large number of transistors integrated in the RF devices, the large amount of power passing through the transistors, and/or the high operation speed of the transistors. Accordingly, it is desirable to package the RF devices in a configuration for better heat dissipation.

Wafer-level fan-out (WLFO) technology and embedded wafer-level ball grid array (eWLB) technology currently attract substantial attention in portable RF applications. WLFO and eWLB technologies are designed to provide high density input/output (I/O) ports without increasing the size of a package. This capability allows for densely packaging the RF devices within a single wafer.

To enhance the operation speed and performance of the RF devices, to accommodate the increased heat generation of the RF devices, to reduce deleterious harmonic distortion of the RF devices, and to utilize advantages of WLFO/eWLB technologies, it is therefore an object of the present disclosure to provide an improved wafer-level fabricating and packaging process for the RF devices with enhanced performance. Further, there is also a need to enhance the performance of the RF devices without increasing the device size.

SUMMARY

The present disclosure relates to a radio frequency (RF) device with nanotube particles for enhanced performance, and process for making the same. The disclosed RF device includes a mold device die and a multilayer redistribution structure. The mold device die includes a device region with a front-end-of-line (FEOL) portion and a back-end-of-line (BEOL) portion, and a first mold compound with nanotube particles. Herein, the FEOL portion resides over the BEOL portion and includes isolation sections and an active layer, which is surrounded by the isolation sections and does not extend vertically beyond the isolation sections. The nanotube particles are dispersed throughout a bottom portion of the first mold compound, and the first mold compound fills gaps among the nanotube particles. The nanotube particles have a higher thermal conductivity than the first mold compound alone, such that the bottom portion of the first mold compound mixed with the nanotube particles has a higher thermal conductivity than a rest portion of the first mold compound alone. The bottom portion of the first mold compound resides over a top surface of the active layer and top surfaces of the isolation sections. Silicon crystal, which has no germanium, nitrogen, or oxygen content, does not exist between the bottom portion of the first mold compound and the active layer. The multilayer redistribution structure, which includes a number of bump structures, is formed underneath the BEOL portion of the mold device die. The bump structures are on a bottom surface of the multilayer redistribution structure and electrically coupled to the FEOL portion of the mold device die.

In one embodiment of the RF device, the nanotube particles have a thermal conductivity between 2 w/m·k and 5000 w/m·k and an electrical resistivity greater than 1E6 Ohm-cm. The first mold compound alone has a thermal conductivity between 1 w/m·k and 20 w/m·k and an electrical resistivity greater than 1E6 Ohm-cm.

In one embodiment of the RF device, the nanotube particles are boron nitride nanotube particles, aluminum nitride nanotube particles, diamond nanotube particles, or carbon nanotube particles.

In one embodiment of the RF device, the mold device die further includes a barrier layer, which continuously resides over the top surface of the active layer and the top surfaces of the isolation sections. The barrier layer is formed of silicon nitride with a thickness between 100 Å and 10 μm. The bottom portion of the first mold compound directly resides over the barrier layer.

In one embodiment of the RF device, the isolation sections extend vertically beyond the top surface of the active layer to define an opening within the isolation sections and over the active layer. Herein, the bottom portion of the first mold compound is over the top surface of the active layer and side surfaces of the isolation sections within the opening, and the top surfaces of the isolation sections.

In one embodiment of the RF device, the mold device die further includes the barrier layer, which continuously resides over the top surface of the active layer and side surfaces of the isolation sections within the opening, and top surfaces of the isolation sections. The barrier layer is formed of silicon nitride with a thickness between 100 Å and 10 μm. The bottom portion of the first mold compound directly resides over the barrier layer.

In one embodiment of the RF device, the mold device die further includes a passivation layer over the top surface of the active layer and within the opening. Herein, the passivation layer is formed of silicon dioxide, and the barrier layer directly resides over the passivation layer.

In one embodiment of the RF device, the bottom portion of the first mold compound mixed with the nanotube particles has a thickness between 1 μm and 100 μm.

In one embodiment of the RF device, the FEOL portion further includes a contact layer. The active layer and the isolation sections of the FEOL portion reside over the contact layer, and the BEOL portion resides underneath the contact layer. The BEOL portion includes connecting layers, and the multilayer redistribution structure further includes redistribution interconnections. Herein, the bump structures are electrically coupled to the FEOL portion of the mold device die via the redistribution interconnections within the multilayer redistribution structure and the connecting layers within the BEOL portion.

In one embodiment of the RF device, the FEOL portion is configured to provide at least one of a switch field-effect transistor (FET), a diode, a capacitor, a resistor, or an inductor.

In one embodiment of the RF device, a top surface of each isolation section and the top surface of the active layer are coplanar.

In one embodiment of the RF device, the active layer is formed from a strained silicon epitaxial layer, in which a lattice constant of silicon is greater than 5.461 at a temperature of 300K.

According to another embodiment, an alternative RF device includes a mold device die and a multilayer redistribution structure. The mold device die includes a device region with a FEOL portion and a BEOL portion, and a first mold compound with nanotube particles. Herein, the FEOL portion resides over the BEOL portion and includes isolation sections and an active layer, which is surrounded by the isolation sections and does not extend vertically beyond the isolation sections. The nanotube particles are dispersed throughout a bottom portion of the first mold compound, and the first mold compound fills gaps among the nanotube particles. The nanotube particles have a higher thermal conductivity than the first mold compound alone, such that the bottom portion of the first mold compound mixed with the nanotube particles has a higher thermal conductivity than a rest portion of the first mold compound alone. The bottom portion of the first mold compound resides over a top surface of the active layer and top surfaces of the isolation sections. Silicon crystal, which has no germanium, nitrogen, or oxygen content, does not exist between the bottom portion of the first mold compound and the active layer. The multilayer redistribution structure, which formed underneath the BEOL portion of the mold device die, extends horizontally beyond the mold device die. The multilayer redistribution structure includes a number of bump structures, which are on a bottom surface of the multilayer redistribution structure, and electrically coupled to the FEOL portion of the mold device die. The alternative RF device further includes a second mold compound residing over the multilayer redistribution structure to encapsulate the mold device die.

In one embodiment of the alternative RF device, the nanotube particles have a thermal conductivity between 2 w/m·k and 5000 w/m·k and an electrical resistivity greater than 1E6 Ohm-cm. The first mold compound alone has a thermal conductivity between 1 w/m·k and 20 w/m·k and an electrical resistivity greater than 1E6 Ohm-cm. The second mold compound has a thermal conductivity no higher than the first mold compound.

In one embodiment of the alternative RF device, the nanotube particles are boron nitride nanotube particles, aluminum nitride nanotube particles, diamond nanotube particles, or carbon nanotube particles.

In one embodiment of the alternative RF device, the mold device die further includes a barrier layer, which continuously resides over the top surface of the active layer and the top surfaces of the isolation sections. The barrier layer is formed of silicon nitride with a thickness between 100 Å and 10 μm. The bottom portion of the first mold compound directly resides over the barrier layer.

In one embodiment of the alternative RF device, the isolation sections extend vertically beyond the top surface of the active layer to define an opening within the isolation sections and over the active layer. Herein, the bottom portion of the first mold compound is over the top surface of the active layer and side surfaces of the isolation sections within the opening, and the top surfaces of the isolation sections.

In one embodiment of the alternative RF device, the mold device die further includes a barrier layer, which continuously resides over the top surface of the active layer and side surfaces of the isolation sections within the opening, and top surfaces of the isolation sections. The barrier layer is formed of silicon nitride with a thickness between 100 Å and 10 μm. The bottom portion of the first mold compound directly resides over the barrier layer.

In one embodiment of the alternative RF device, the mold device die further includes a passivation layer over the top surface of the active layer and within the opening. Herein, the passivation layer is formed of silicon dioxide, and the barrier layer directly resides over the passivation layer.

In one embodiment of the alternative RF device, the bottom portion of the first mold compound mixed with the nanotube particles has a thickness between 1 μm and 100 μm.

In one embodiment of the alternative RF device, a top surface of each isolation section and the top surface of the active layer are coplanar.

In one embodiment of the alternative RF device, the active layer is formed from a strained silicon epitaxial layer, in which a lattice constant of silicon is greater than 5.461 at a temperature of 300K.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A-17 show an exemplary wafer-level fabricating and packaging process that illustrates steps to provide the exemplary RF device shown in FIG. 1.

FIGS. 18-23 show an alternative wafer-level fabricating and packaging process that illustrates steps to provide the alternative RF device shown in FIG. 2.

Figure 1:
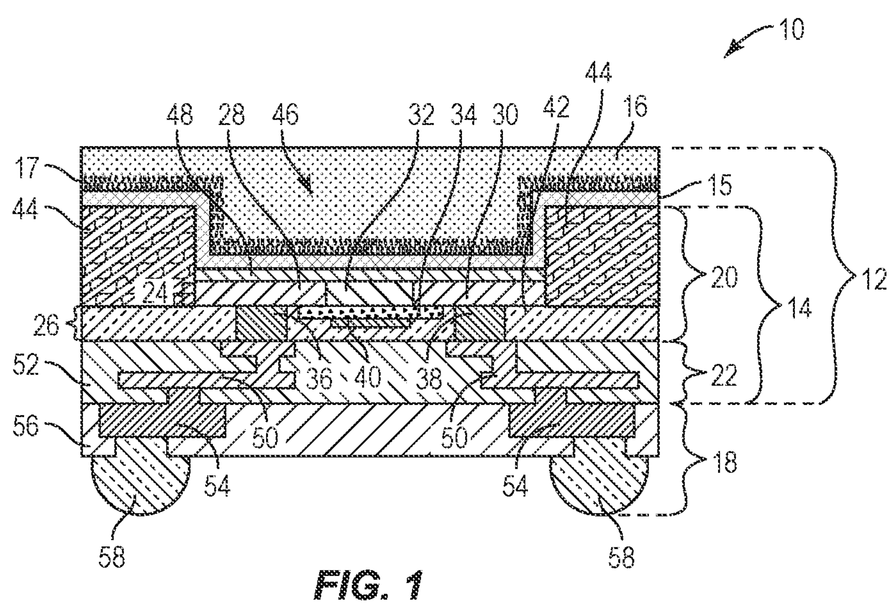
FIG. 1 shows an exemplary radio frequency (RF) device with nanotube particles for enhanced performance according to one embodiment of the present disclosure.

It will be understood that for clear illustrations, FIGS. 1-23 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term “and/or” includes any and all combinations of one or more of the associated listed items.

It will be understood that when an element such as a layer, region, or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. Likewise, it will be understood that when an element such as a layer, region, or substrate is referred to as being “over” or extending “over” another element, it can be directly over or extend directly over the other element or intervening elements may also be present. In contrast, when an element is referred to as being “directly over” or extending “directly over” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Relative terms such as “below” or “above” or “upper” or “lower” or “horizontal” or “vertical” may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including” when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the looming shortage of conventional radio frequency silicon on insulator (RFSOI) wafers expected in the coming years, alternative technologies are being devised to get around the need for high resistivity using silicon wafers, a trap rich layer formation, and Smart-Cut SOI wafer process. One alternative technology is based on the use of a silicon germanium (SiGe) interfacial layer instead of a buried oxide layer (BOX) between a silicon substrate and a silicon epitaxial layer. However, this technology will also suffer from the deleterious distortion effects due to the silicon substrate, similar to what is observed in RFSOI technology. The present disclosure, which relates to a radio frequency (RF) device with enhanced performance, and a wafer-level fabricating and packaging process for making the same, utilizes the SiGe interfacial layer without the deleterious distortion effects from the silicon substrate.

FIG. 1 shows an exemplary RF device 10 according to one embodiment of the present disclosure. For the purpose of this illustration, the exemplary RF device 10 includes a mold device die 12 that has a device region 14, a barrier layer 15, and a first mold compound 16 with nanotube particles 17, and a multilayer redistribution structure 18 formed under the device region 14 of the mold device die 12.

In detail, the device region 14 includes a front-end-of-line (FEOL) portion 20 and a back-end-of-line (BEOL) portion 22 underneath the FEOL portion 20. In one embodiment, the FEOL portion 20 may be configured to provide a switch field-effect transistor (FET), and includes an active layer 24 and a contact layer 26. The active layer 24 may be formed from a relaxed silicon epitaxial layer or from a strained silicon epitaxial layer, and includes a source 28, a drain 30, and a channel 32 between the source 28 and the drain 30. Herein, the relaxed silicon epitaxial layer refers to a silicon epitaxial layer, in which the lattice constant of silicon is 5.431 at a temperature of 300K. The strained silicon epitaxial layer refers to a silicon epitaxial layer, in which the lattice constant of silicon is greater than the lattice constant in the relaxed silicon epitaxial layer, such as greater than 5.461, or greater than 5.482, or greater than 5.493, or greater than 5.515 at a temperature of 300K. As such, electrons in the strained silicon epitaxial layer may have enhanced mobility compared to the relaxed silicon epitaxial layer. Consequently, the FET formed from the strained silicon epitaxial layer may have a faster switching speed compared to the FET formed from the relaxed silicon epitaxial layer.

The contact layer 26 is formed underneath the active layer 24 and includes a gate structure 34, a source contact 36, a drain contact 38, and a gate contact 40. The gate structure 34 may be formed of silicon oxide, and extends horizontally underneath the channel 32 (i.e., from underneath the source 28 to underneath the drain 30). The source contact 36 is connected to and under the source 28, the drain contact 38 is connected to and under the drain 30, and the gate contact 40 is connected to and under the gate structure 34. An insulating material 42 may be formed around the source contact 36, the drain contact 38, the gate structure 34, and the gate contact 40 to electrically separate the source 28, the drain 30, and the gate structure 34. In different applications, the FEOL portion 20 may have different FET configurations or provide different device components, such as a diode, a capacitor, a resistor, and/or an inductor.

In addition, the FEOL portion 20 also includes isolation sections 44, which reside over the insulating material 42 of the contact layer 26 and surround the active layer 24. The isolation sections 44 are configured to electrically separate the RF device 10, especially the active layer 24, from other devices formed in a common wafer (not shown). Herein, the isolation sections 44 may extend from a top surface of the contact layer 26 and vertically beyond a top surface of the active layer 24 to define an opening 46 that is within the isolation sections 44 and over the active layer 24. The isolation sections 44 may be formed of silicon dioxide, which may be resistant to etching chemistries such as tetramethylammonium hydroxide (TMAH), xenon difluoride ($XeF_2$), potassium hydroxide (KOH), sodium hydroxide (NaOH), or acetylcholine (ACH), and may be resistant to a dry etching system, such as a reactive ion etching (RIE) system with a chlorine-based gas chemistry.

In some applications, the active layer 24 may be passivated to achieve proper low levels of current leakage. The passivation may be accomplished with deposition of a passivation layer 48 over the top surface of the active layer 24 and within the opening 46. The passivation layer 48 may be formed of silicon dioxide. In some applications, the RF device 10 may further include an interfacial layer and/or a buffer structure (not shown), which are formed of SiGe, over the top surface of the active layer 24 (described in the following paragraphs and not shown herein). If the passivation layer 48, the buffer structure, and the interfacial layer exist, the interfacial layer and the buffer structure are vertically between the active layer 24 and the passivation layer 48.

The barrier layer 15 extends over an entire backside of the device region 14, such that the barrier layer 15 continuously covers exposed surfaces within the opening 46 and top surfaces of the isolation sections 44. If the passivation layer 48 exists, the barrier layer 15 resides over the passivation layer 48. If the passivation layer 48 is omitted, and the interfacial layer and/or the buffer structure exist, the barrier layer 15 resides over the interfacial layer or the buffer structure (not shown). If the passivation layer 48, the buffer structure, and the interfacial layer are omitted, the barrier layer 15 may be in contact with the active layer 24 of the FEOL portion 20 (not shown). Note that the barrier layer 15 always covers the active layer 24.

Herein, the barrier layer 15 may be formed of silicon nitride with a thickness between 100 Å and 10 μm. The barrier layer 15 is configured to provide an excellent barrier to moisture and impurities, which could diffuse into the channel 32 of the active layer 24 and cause reliability concerns in the device. Moisture, for example, may diffuse readily through a silicon oxide layer (like the passivation layer 48), but even a thin nitride layer (like the barrier layer 15) reduces the diffusion of the water molecule by several orders of magnitude, acting as an ideal barrier. In addition, the barrier layer 15 may also be engineered so as to provide additional tensile strain to the active layer 24. Such strain may be beneficial in providing additional improvements of electron mobility in n-channel devices. In some applications, the barrier layer 15 formed of silicon nitride may further passivate the active layer 24. In such case, there may be no need for the passivation layer 48 described above. In some applications, the barrier layer 15 may be omitted.

The first mold compound 16 with the nanotube particles 17 may be directly over the barrier layer 15 and fills the opening 46. The nanotube particles 17 are dispersed throughout a bottom portion of the first mold compound 16, and the first mold compound 16 fills gaps among the nanotube particles 17 (no air pockets or voids). As such, the nanotube particles 17 may be fully dispersed over the barrier layer 15. The nanotube particles 17 may be any nanotube particles with a high thermal conductivity (between 2 w/m·k and 5000 w/m·k) and a high electrical resistivity (greater than 1E6 Ohm-cm). In a non-limiting example, the nanotube particles 17 may be boron nitride nanotube particles, aluminum nitride nanotube particles, diamond nanotube particles, or any other nanotube particle system which exhibit a high thermal conductivity (greater than 2 w/m·k) and high electrical resistivity (greater than 1E6 Ohm-cm). Typically, the thermal conductivity of the nanotube particles 17 is higher than a thermal conductivity of the first mold compound 16. Consequently, the bottom portion of the first mold compound 16 mixed with the nanotube particles 17 has a greater thermal conductivity than the rest portion (upper portion) of the first mold compound 16 alone.

Heat generated in the device region 14 will travel upward to an area above the active layer 24, then will pass laterally in the area above the active layer 24, and lastly will pass downward through the device region 14 and toward the multilayer redistribution structure 18, which will dissipate the heat. It is therefore highly desirable to have a high thermal conductivity region adjacent to the active layer 24. Consequently, the higher the thermal conductivity in the adjacent region above the active layer 24, the better the heat dissipation performance of the device region 14. In this embodiment, the nanotube particles 17 may be directly over the barrier layer 15. If there is no barrier layer 15, the nanotube particles 17 may be directly over the passivation layer 48 and directly over inner side surfaces and the top surfaces of the isolation sections 44 (not shown). If there is no barrier layer 15 and no passivation layer 48, the nanotube particles 17 may be directly over the interfacial layer (the buffer structure), and directly over inner side surfaces and the top surfaces of the isolation sections 44 (not shown). If there is no barrier layer 15, no passivation layer 48, and no interfacial layer/buffer structure, the nanotube particles 17 may be directly over the active layer 24 and directly over inner side surfaces and the top surfaces of the isolation sections 44 (not shown). Depending on a required thermal performance of the RF device 10, a device layout, the distance from the multilayer redistribution structure 18, as well as the specifics of the package and assembly, the bottom portion of the first mold compound 16 mixed with the nanotube particles 17 may have a thickness between 1 μm and 100 μm.

The first mold compound 16 is also adjacent to the device region 14, thus the first mold compound 22 is also desired to have a relative high thermal conductivity (between 1 w/m·k and 20 w/m·k), and a high electrical resistivity greater than 1E6 Ohm-cm. In a non-limiting example, the first mold compound 16 may be formed of thermoplastics or thermoset polymer materials, such as polyphenylene sulfide (PPS) overmold epoxies. A total thickness of the first mold compound 16 is also based on the required thermal performance of the RF device 10, the device layout, the distance from the multilayer redistribution structure 18, as well as the specifics of the package and assembly. The first mold compound 16 may have a total thickness between 200 μm and 500 μm.

Notice that, regardless of the presence of the barrier layer 15, the passivation layer 48, or the interfacial layer (the buffer structure), silicon crystal, which has no germanium, nitrogen, or oxygen content, does not exist between the bottom portion of the first mold compound 16 (which is mixed with the nanotube particles 17) and the top surface of the active layer 24. Each of the barrier layer 15, the passivation layer 48, and the interfacial layer is formed of silicon composite.

Further, in some applications, the top surface of each isolation section 44 and the top surface of the active layer 24 may be coplanar (not shown), and the opening 46 is omitted. The barrier layer 15 resides over both the active layer 24 and the isolation sections 44 of the FEOL portion 20, and the bottom portion of the first mold compound 16 (which is mixed with the nanotube particles 17) resides over the barrier layer 15. Note that the active layer 24 never extends vertically beyond the isolation sections 44, otherwise the isolation sections 44 may not fully separate the active layer 24 from other devices formed from the same wafer.

The BEOL portion 22 is underneath the FEOL portion 20 and includes multiple connecting layers 50 formed within dielectric layers 52. Some of the connecting layers 50 (for internal connection) are encapsulated by the dielectric layers 52 (not shown), while some of the connecting layers 50 have a bottom portion not covered by the dielectric layers 52. Certain connecting layers 50 are electrically connected to the FEOL portion 20. For the purpose of this illustration, one of the connecting layers 50 is connected to the source contact 36, and another connecting layer 50 is connected to the drain contact 38.

The multilayer redistribution structure 18, which is formed underneath the BEOL portion 22 of the mold device die 12, includes a number of redistribution interconnections 54, a dielectric pattern 56, and a number of bump structures 58. Herein, each redistribution interconnection 54 is connected to a corresponding connecting layer 50 within the BEOL portion 22 and extends over a bottom surface of the BEOL portion 22. The connections between the redistribution interconnections 54 and the connecting layers 50 are solder-free. The dielectric pattern 56 is formed around and underneath each redistribution interconnection 54. Some of the redistribution interconnections 54 (connect the mold device die 12 to other device components formed from the same wafer) may be encapsulated by the dielectric pattern 56 (not shown), while some of the redistribution interconnections 54 have a bottom portion exposed through the dielectric pattern 56. Each bump structure 58 is formed at a bottom surface of the multilayer redistribution structure 18 and electrically coupled to a corresponding redistribution interconnection 54 through the dielectric pattern 56. As such, the redistribution interconnections 54 are configured to connect the bump structures 58 to certain ones of the connecting layers 50 in the BEOL portion 22, which are electrically connected to the FEOL portion 20. Consequently, the bump structures 58 are electrically connected to the FEOL portion 20 via corresponding redistribution interconnections 54 and corresponding connecting layers 50. In addition, the bump structures 58 are separate from each other and protrude from the dielectric pattern 56.

In some applications, there may be extra redistribution interconnections (not shown) electrically coupled to the redistribution interconnections 54 through the dielectric pattern 56, and extra dielectric patterns (not shown) formed underneath the dielectric pattern 56, such that a bottom portion of some extra redistribution interconnections may be exposed. Consequently, each bump structure 58 is coupled to a corresponding extra redistribution interconnection through the extra dielectric pattern (not shown). Regardless of the level numbers of the redistribution interconnections and/or the dielectric pattern, the multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals. The dielectric pattern 56 may be formed of benzocyclobutene (BCB), polyimide, or other dielectric materials. The bump structures 58 may be solder balls or copper pillars. The multilayer redistribution structure 18 has a thickness between 2 μm and 300 μm.

Figure 2:
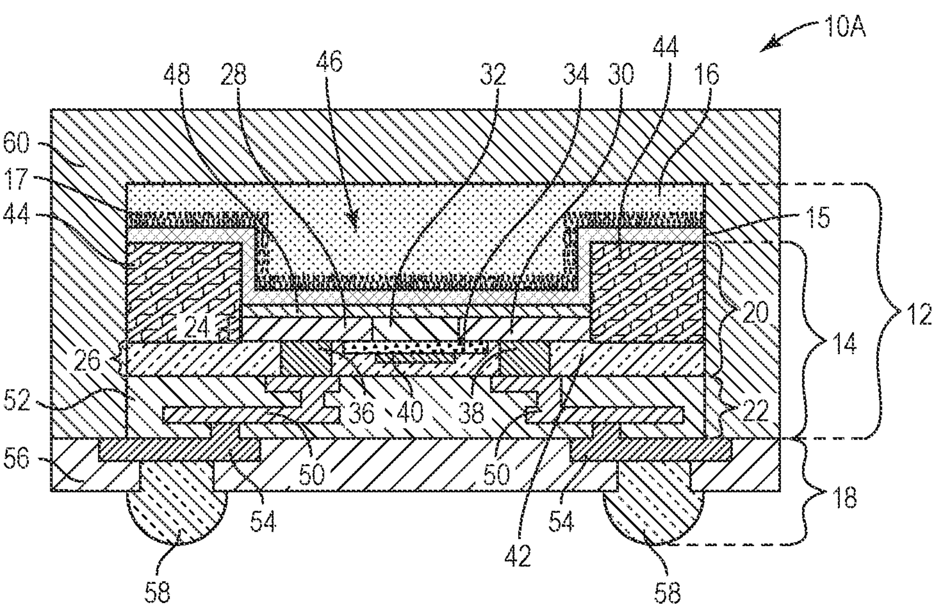
FIG. 2 shows an alternative RF device according to one embodiment of the present disclosure.

FIG. 2 shows an alternative RF device 10A, which further includes a second mold compound 60 compared to the RF device 10 shown in FIG. 1. Herein, the multilayer redistribution structure 18 may extend horizontally beyond the mold device die 12, and the second mold compound 60 resides over the multilayer redistribution structure 18 to encapsulate the mold device die 12. In this embodiment, the redistribution interconnections 54 of the multilayer redistribution structure 18 may extend horizontally beyond the mold device die 12, and the bump structures 58 of the multilayer redistribution structure 18 may not be confined within a periphery of the mold device die 12. The second mold compound 60 may be formed of a same or different material as the first mold compound 16. Unlike the first mold compound 16, the second mold compound 60 may not have thermal conductivity or electrical resistivity requirements.

FIG. 3A through FIG. 17 provide an exemplary wafer-level fabricating and packaging process that illustrates steps to fabricate the exemplary RF device 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3A-17.

Figures 3A, 3B, 3C:
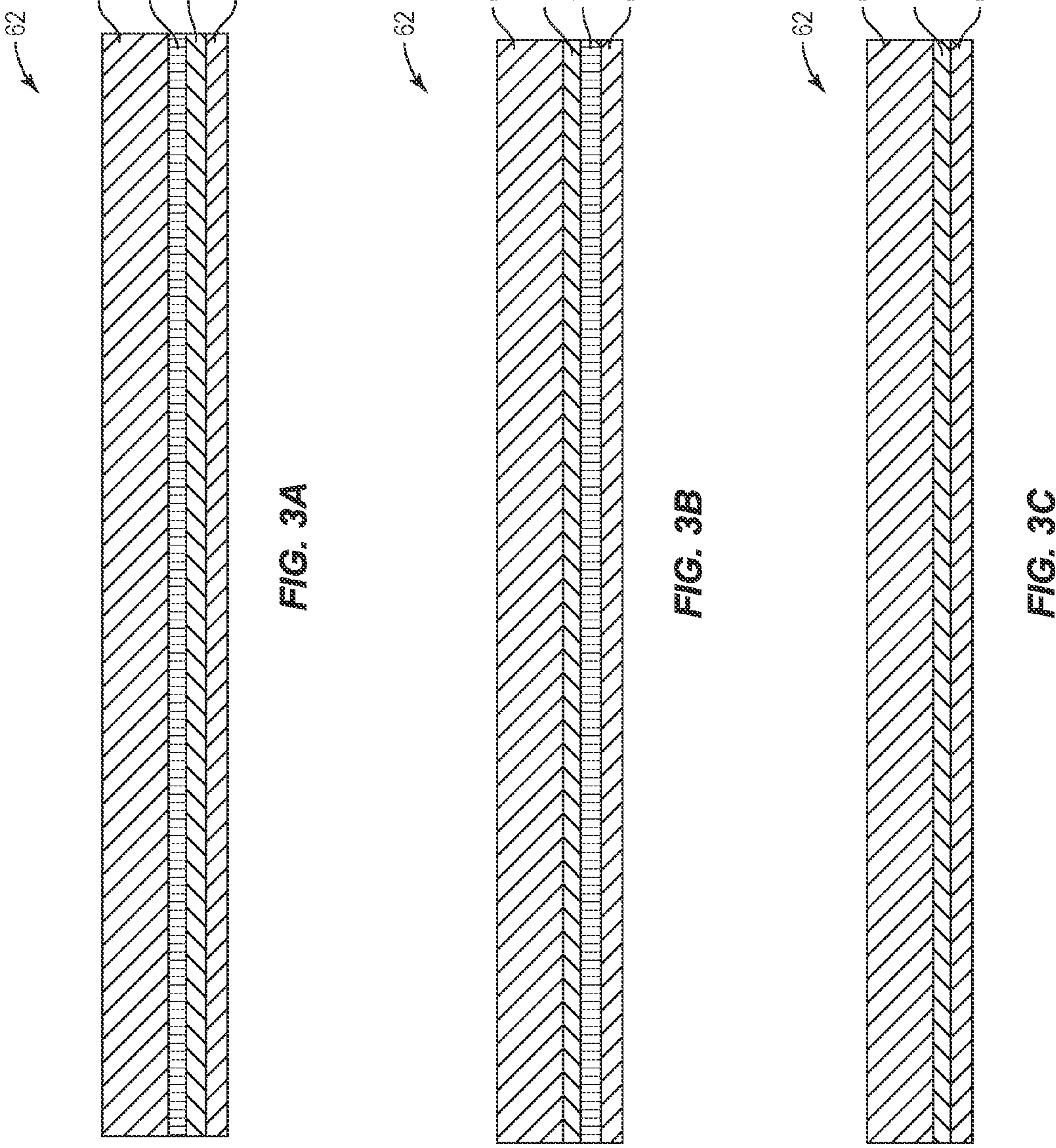

Initially, a starting wafer 62 is provided as illustrated in FIGS. 3A-3C. The starting wafer 62 includes a common silicon epitaxial layer 64, a common interfacial layer 66 over the common silicon epitaxial layer 64, and a silicon handle substrate 68 over the common interfacial layer 66. Herein, the common silicon epitaxial layer 64 is formed from a device grade silicon material, which has desirable silicon epitaxy characteristics to form electronic devices. The silicon handle substrate 68 may consist of conventional low cost, low resistivity, and high dielectric constant silicon, which may have a lattice constant about 5.431 at a temperature of 300K. The common interfacial layer 66 is formed of SiGe, which separates the common silicon epitaxial layer 64 from the silicon handle substrate 68.

At a fixed temperature, e.g., 300K, a lattice constant of relaxed silicon is 5.431 Å, while a lattice constant of relaxed $Si_{1-x}Ge_x$ depends on the germanium concentration, such as $(5.431+0.2x+0.027x^2)$Å. The lattice constant of relaxed SiGe is larger than the lattice constant of relaxed silicon. If the common interfacial layer 66 is directly grown under the silicon handle substrate 68, the lattice constant in the common interfacial layer 66 will be strained (reduced) by the silicon handle substrate 68. If the common silicon epitaxial layer 64 is directly grown under the common interfacial layer 66, the lattice constant in the common silicon epitaxial layer 64 may remain as the original relaxed form (about the same as the lattice constant in the silicon substrate). Consequently, the common silicon epitaxial layer 64 may not enhance electron mobility.

In one embodiment, a common buffer structure 70 may be formed between the silicon handle substrate 68 and the common interfacial layer 66, as illustrated in FIG. 3A. The common buffer structure 70 allows lattice constant transition from the silicon handle substrate 68 to the common interfacial layer 66. The common buffer structure 70 may include multiple layers and may be formed of SiGe with a vertically graded germanium concentration. The germanium concentration within the common buffer structure 70 may increase from 0% at a top side (next to the silicon handle substrate 68)

to X % at a bottom side (next to the common interfacial layer 66). The X % may depend on the germanium concentration within the common interfacial layer 66, such as 15%, or 25%, or 30%, or 40%. The common interfacial layer 66, which herein is grown under the common buffer structure 70, may keep its lattice constant in relaxed form, and may not be strained (reduced) to match the lattice constant of the silicon handle substrate 68. The germanium concentration may be uniform throughout the common interfacial layer 66 and greater than 15%, 25%, 30%, or 40%, such that the lattice constant of relaxed SiGe in the common interfacial layer 66 is greater than 5.461, or greater than 5.482, or greater than 5.493, or greater than 5.515 at a temperature of 300K.

Herein, the common silicon epitaxial layer 64 is grown directly under the relaxed common interfacial layer 66, such that the common silicon epitaxial layer 64 has a lattice constant matching (stretching as) the lattice constant in the relaxed common interfacial layer 66. Consequently, the lattice constant in the strained common silicon epitaxial layer 64 may be greater than 5.461, or greater than 5.482, or greater than 5.493, or greater than 5.515 at a temperature of 300K, and therefore greater than the lattice constant in a relaxed silicon epitaxial layer (e.g., 5.431 at a temperature of 300K). The strained common silicon epitaxial layer 64 may have higher electron mobility than a relaxed silicon epitaxial layer. A thickness of the common silicon epitaxial layer 64 may be between 700 nm and 2000 nm, a thickness of the common interfacial layer 66 may be between 200 Å and 600 Å, a thickness of the common buffer structure 70 may be between 100 nm and 1000 nm, and a thickness of the silicon handle substrate 68 may be between 200 μm and 700 μm.

In another embodiment, the common interfacial layer 66 may be formed directly under the silicon handle substrate 68, and the common buffer structure 70 may be formed between the common interfacial layer 66 and the common silicon epitaxial layer 64, as illustrated in FIG. 3B. Herein, the lattice constant of the common interfacial layer 66 may be strained (reduced) by the silicon handle substrate 68. The common buffer structure 70 may still be formed of SiGe with a vertically graded germanium concentration. The germanium concentration within the common buffer structure 70 may increase from 0% at a top side (next to the common interfacial layer 66) to X % at a bottom side (next to the common silicon epitaxial layer 64). The X % may be 15%, or 25%, or 30%, or 40%. The lattice constant at the bottom side of the common buffer structure 70 is greater than a lattice constant at the top side of the common buffer structure 70. The common silicon epitaxial layer 64, which herein is grown under the common buffer structure 70, has a lattice constant matching (stretching as) the lattice constant at the bottom side of the common buffer structure 70. Consequently, the lattice constant in the strained common silicon epitaxial layer 64 is greater than the lattice constant in a relaxed silicon epitaxial layer (e.g., 5.431 at a temperature of 300K).

In some applications, the common buffer structure 70 is omitted, as illustrated in FIG. 3C. The common interfacial layer 66 is grown directly under the silicon handle substrate 68 and the common silicon epitaxial layer 64 is grown directly under the common interfacial layer 66. As such, the lattice constant in the common interfacial layer 66 is strained (reduced) to match the lattice constant in the silicon handle substrate 68, and the lattice constant in the common silicon epitaxial layer 64 remains as the original relaxed form (about the same as the lattice constant in the silicon substrate).

Figures 4A, 4B:
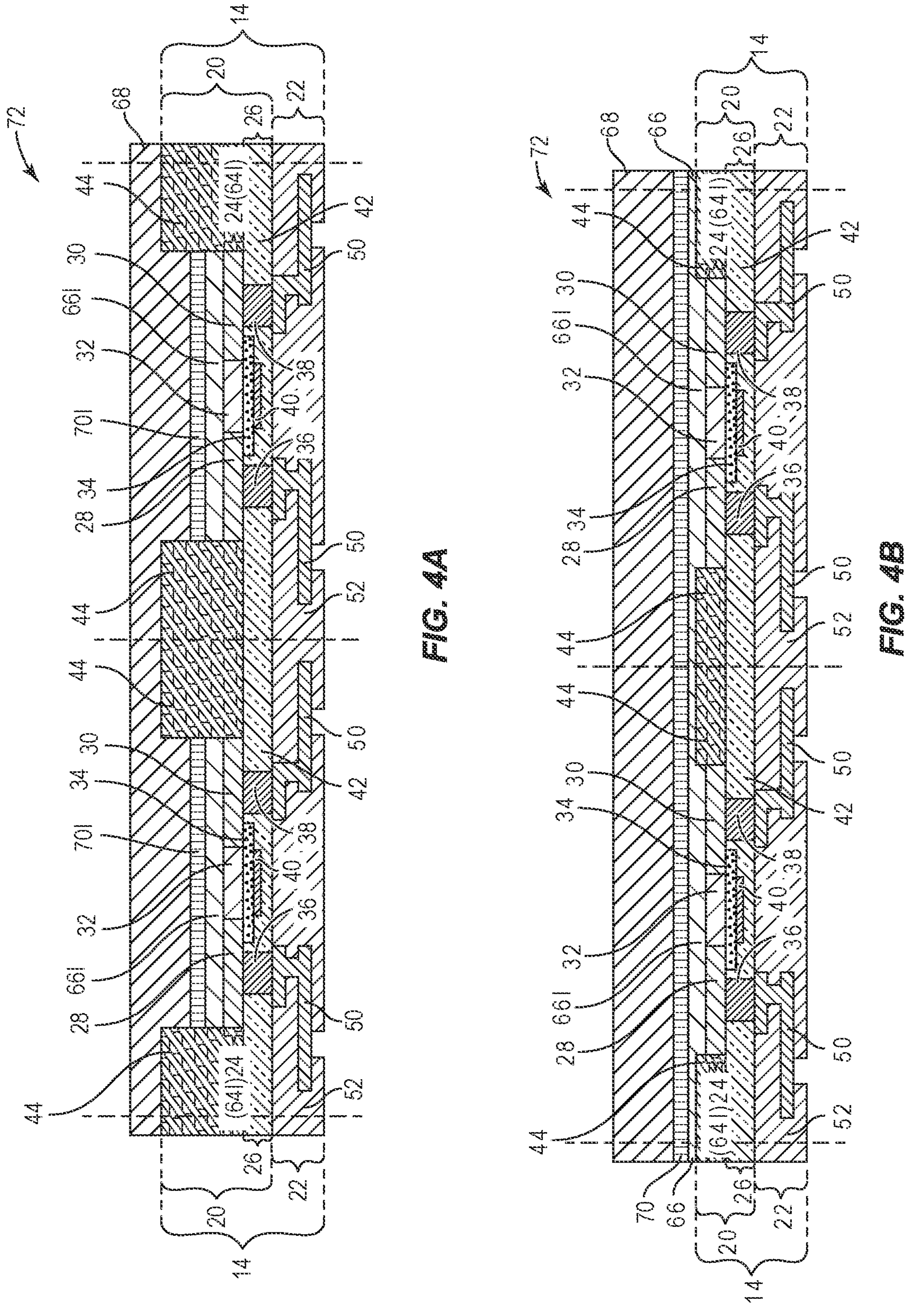

Next, a complementary metal-oxide-semiconductor (CMOS) process is performed on the starting wafer 62 (in FIG. 3A) to provide a precursor wafer 72 with a number of the device regions 14, as illustrated in FIG. 4A. For the purpose of this illustration, the FEOL portion 20 of each device region 14 is configured to provide a switch FET. In different applications, the FEOL portion 20 may have different FET configurations or provide different device components, such as a diode, a capacitor, a resistor, and/or an inductor.

In one embodiment, the isolation sections 44 of each device region 14 extend through the common silicon epitaxial layer 64, the common interfacial layer 66, and the common buffer structure 70, and extend into the silicon handle substrate 68. As such, the common buffer structure 70 is separated into a number of individual buffer structures 70I, the common interfacial layer 66 is separated into a number of individual interfacial layers 66I, and the common silicon epitaxial layer 64 is separated into a number of individual silicon epitaxial layers 64I. Each individual silicon epitaxial layer 64I is used to form a corresponding active layer 24 in one device region 14. The isolation sections 44 may be formed by shallow trench isolation (STI). Herein, if the active layer 24 is formed from one individual silicon epitaxial layer 64I with the strained (increased) lattice constant, the FET based on the active layer 24 may have a faster switching speed (lower ON-resistance) than the FET formed from the relaxed silicon epitaxial layer with relaxed lattice constant.

The top surface of the active layer 24 is in contact with the corresponding interfacial layer 66I, which is underneath the corresponding buffer structure 70I. The silicon handle substrate 68 resides over each individual buffer structure 70I, and portions of the silicon handle substrate 68 may reside over the isolation sections 44. The BEOL portion 22 of the device region 14, which includes at least the multiple connecting layers 50 and the dielectric layers 52, is formed under the contact layer 26 of the FEOL portion 20. Bottom portions of certain multiple connecting layers 50 are exposed through the dielectric layers 52 at the bottom surface of the BEOL portion 22.

In another embodiment, the isolation sections 44 may not extend into the silicon handle substrate 68. Instead, the isolation sections 44 may only extend through the common silicon epitaxial layer 64 and extend into the common interfacial layer 66, as illustrated in FIG. 4B. Herein, the common interfacial layer 66 remains continuous, and resides over the top surface of each active layer 24 and a top surface of each isolation section 44. The common buffer structure 70 and the silicon handle substrate 68 remain intact. In addition, the isolation sections 44 may extend through the common silicon epitaxial layer 64 and the common interfacial layer 66, and extend into the common buffer structure 70 (not shown). The common buffer structure 70 remains continuous and resides over each individual interfacial layer 66I and each isolation section 44. The silicon handle substrate 68 remains over the common buffer structure 70. Further, the isolation sections 44 may extend through the common silicon epitaxial layer 64 but do not extend into the common interfacial layer 66 (not shown). The top surface of each isolation section 44 and the top surface of each active layer 24 may be coplanar (not shown). The common interfacial layer 66, the common buffer structure 70, and the silicon handle substrate 68 remain intact. The common interfacial layer 66 is over each isolation section 44 and each active layer 24, the common buffer structure 70 remains over the common interfacial layer 66, and the silicon handle substrate 68 remains over the common buffer structure 70.

Figures 5, 6:
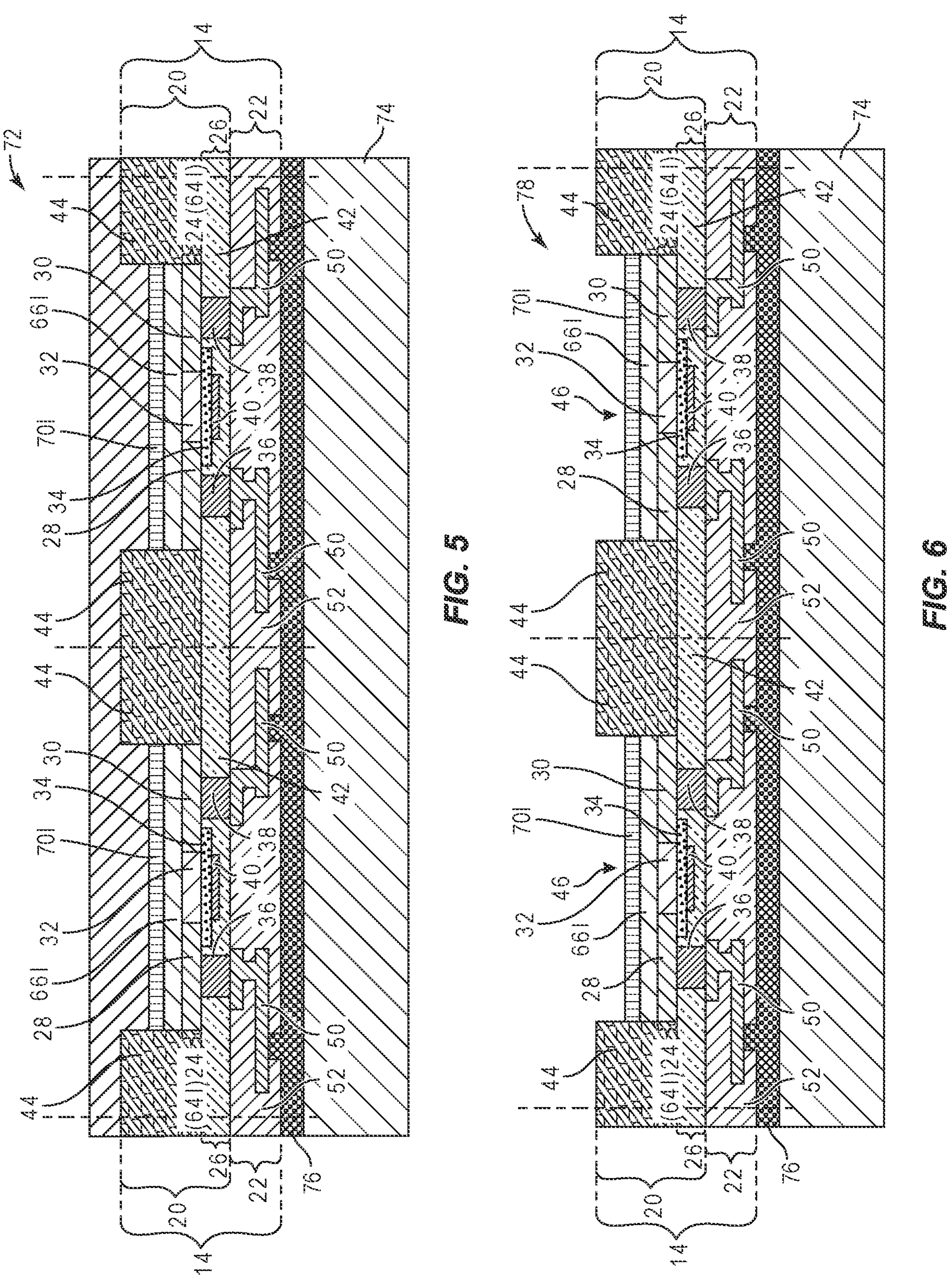

After the precursor wafer 72 is completed, the precursor wafer 72 is then bonded to a temporary carrier 74, as illustrated in FIG. 5. The precursor wafer 72 may be bonded to the temporary carrier 74 via a bonding layer 76, which provides a planarized surface to the temporary carrier 74. The temporary carrier 74 may be a thick silicon wafer from a cost and thermal expansion point of view, but may also be constructed of glass, sapphire, or any other suitable carrier material. The bonding layer 76 may be a span-on polymeric adhesive film, such as the Brewer Science WaferBOND line of temporary adhesive materials.

The silicon handle substrate 68 is then selectively removed to provide an etched wafer 78, as illustrated in FIG. 6. The selective removal stops at each individual buffer structure 70I or at each interfacial layer 66I. If the isolation sections 44 extend vertically beyond each individual buffer structure 70I, the removal of the silicon handle substrate 68 will provide the opening 46 over each active layer 24 and within the isolation sections 44. Removing the silicon handle substrate 68 may be provided by a mechanical grinding process and an etching process, or provided by the etching system itself. As an example, the silicon handle substrate 68 may be ground to a thinner thickness to reduce the following etching time. An etching process is then performed to at least completely remove the remaining silicon handle substrate 68. Since the silicon handle substrate 68, the individual buffer structure 70I, and the individual interfacial layer 66I have different germanium concentrations, they may have different reactions to a same etching technique (for instance: different etching speeds with a same etchant). Consequently, the etching system may be capable of identifying the presence of the individual buffer structures 70I or the individual interfacial layers 66I (presence of germanium), and capable of indicating when to stop the etching process. Typically, the higher the germanium concentration, the better the etching selectivity between the silicon handle substrate 68 and the individual buffer structures 70I (or between the silicon handle substrate 68 and the individual interfacial layers 66I). The etching process may be provided by a wet etching system with an etchant chemistry, which is at least one of TMAH, KOH, NaOH, ACH, and $XeF_2$, or a dry etching system, such as a reactive ion etching system with a chlorine-based gas chemistry.

During the removal process, the isolation sections 44 are not removed and protect sides of each active layer 24. The bonding layer 76 and the temporary carrier 74 protect the bottom surface of each BEOL portion 22. Herein, the top surface of each isolation section 44 and the top surface of each individual buffer structure 70I (or each individual interfacial layer 66I) are exposed after the removal step. If the isolation sections 44 only extend into the common buffer structure 70, or only extend into the common interfacial layer 66, or the top surface of each isolation section 44 and the top surface of each active layer 24 are coplanar, only the top surface of the common buffer structure 70 or the common interfacial layer 66 may be exposed (not shown).

Figures 7, 8:
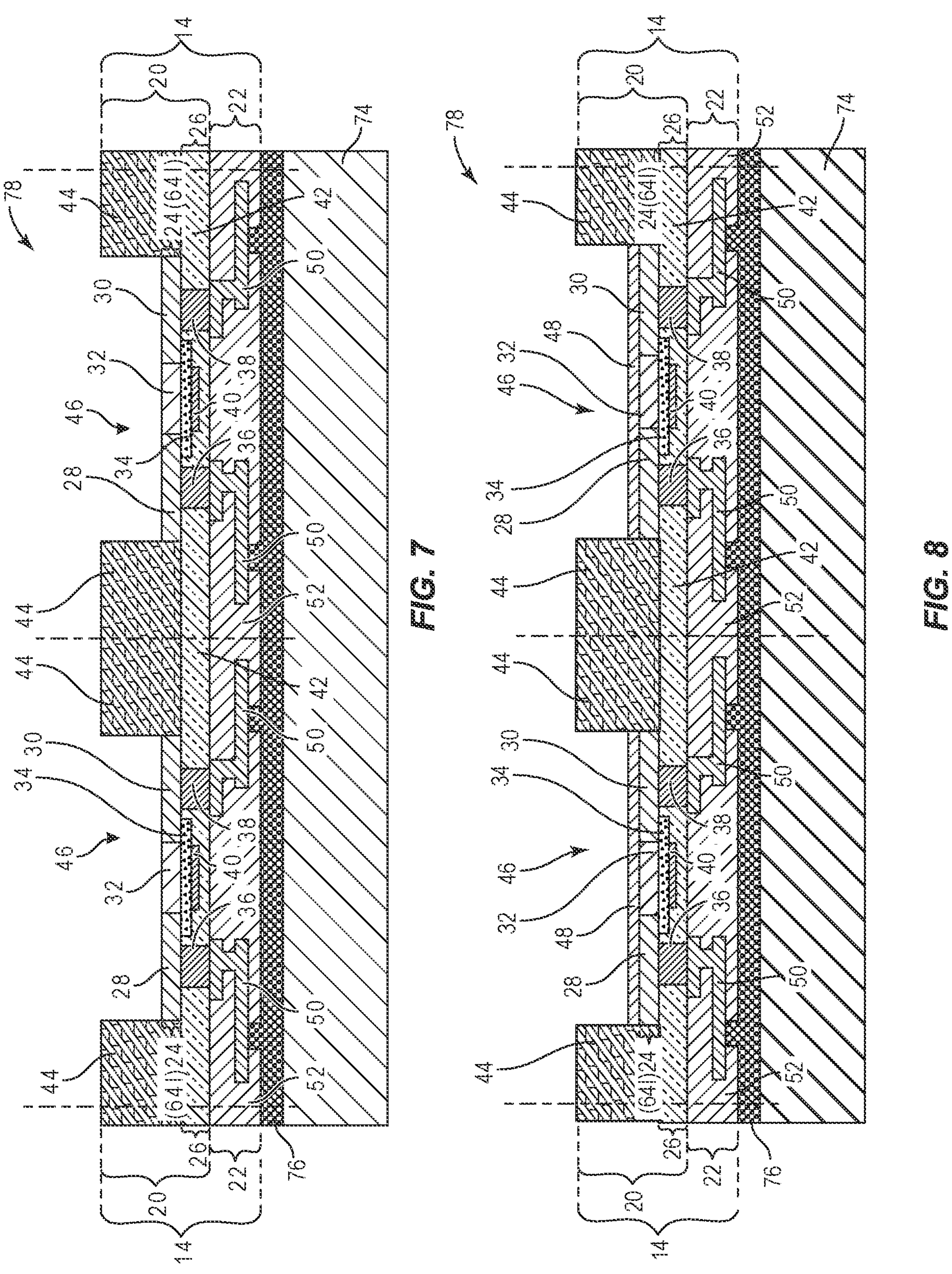

Due to the narrow gap nature of the SiGe material, it is possible that the individual buffer structures 70I and/or the individual interfacial layers 66I may be conductive (for some type of devices). The individual buffer structures 70I and/or the individual interfacial layers 66I may cause appreciable leakage between the source 28 and the drain 30 of the active layer 24. Therefore, in some applications, such as FET switch applications, it is desirable to also remove the individual buffer structures 70I and the individual interfacial layers 66I, as illustrated in FIG. 7. Each active layer 24 is exposed (at a bottom of a corresponding opening 46, if there is one opening 46 over each active layer 24). The individual buffer structures 70I and the individual interfacial layers 66I may be removed by the same etching process used to remove the silicon handle substrate 68, or may be removed by another etching process, such as a chlorine-base dry etching system. Herein, if each individual interfacial layer 66I is thin enough, it may not cause any appreciable leakage between the source 28 and the drain 30 of the FEOL portion 20. In that case, the individual interfacial layers 66I may be left (not shown). Similarly, if both the individual interfacial layer 66I and the individual buffer structure 70I are thin enough, they may not cause any appreciable leakage between the source 28 and the drain 30 of the FEOL portion 20. Such that, the individual interfacial layers 66I and the individual buffer structures 70I may be left (as shown in FIG. 6).

In some applications, after the removal of the silicon handle substrate 68, the individual buffer structures 70I, and the individual interfacial layers 66I, the active layer 24 may be passivated to achieve proper low levels of current leakage in the device. The passivation layer 48 may be formed directly over each active layer 24 of each FEOL portion 20, as illustrated in FIG. 8. The passivation layer 48 may be formed of silicon dioxide by a plasma enhanced deposition process, an anodic oxidation process, an ozone-based oxidation process, or a number of other proper techniques. If there is one opening 46 over each active layer 24 and within the isolation sections 44, the passivation layer 48 is formed within the opening 46. The passivation layer 48 is configured to terminate the surface bonds at the top surface of the active layer 24, which may be responsible for unwanted leakage.

Figures 9, 10:
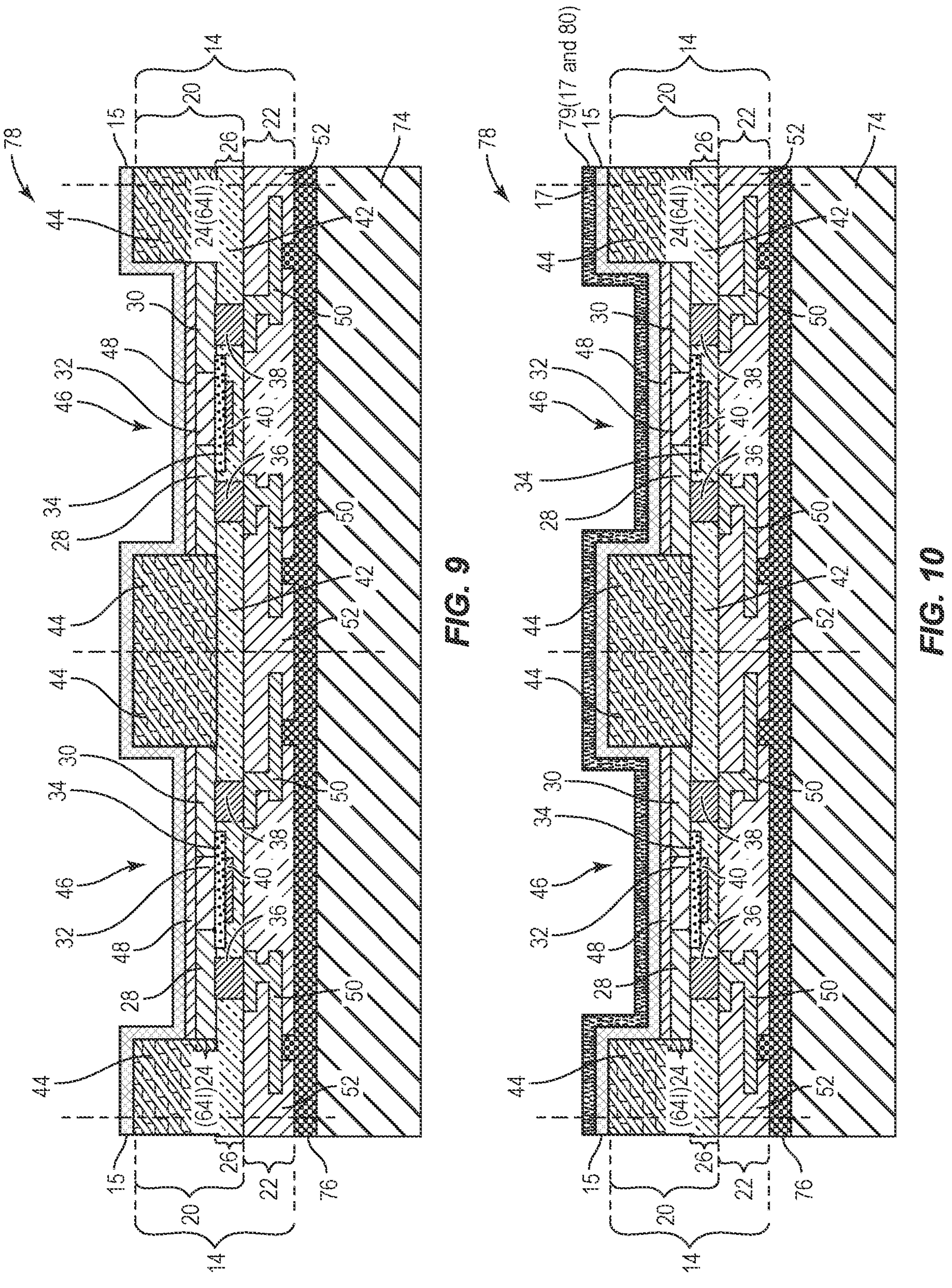

Next, the barrier layer 15 may be applied continuously over an entire backside of the etched wafer 78, as illustrated in FIG. 9. Herein, the barrier layer 15 covers exposed surfaces within each opening 46 and covers the top surface of each isolation section 44. If the passivation layer 48 is applied, the barrier layer 15 is in contact with a top surface of each passivation layer 48, and side surfaces of each isolation section 44 within each opening 46. If the passivation layer 48 does not exist, and the individual interfacial layer 66I and/or the individual buffer structure 70I remain, the barrier layer 15 is in contact with a top surface of the individual interfacial layer 66I or the individual buffer structures 70I, and the side surfaces of each isolation section 44 within each opening 46 (not shown). If the passivation layer 48, the individual interfacial layer 66I, and the individual buffer structure 70I do not exist, the barrier layer 15 is in contact with a top surface of each active layer 24 and the side surfaces of each isolation section 44 within each opening 46 (not shown). The barrier layer 15 always resides over the top surface of each active layer 24, covers side surfaces of each isolation section 44 within each opening 46, and covers the top surface of each isolation section 44.

Herein, the barrier layer 15 may be formed of silicon nitride with a thickness between 100 Å and 10 μm. The barrier layer 15 is configured to provide an excellent barrier to moisture and impurities, which could diffuse into the channel 32 of the active layer 24 and cause reliability concerns in the device. Moisture, for example, may diffuse readily through a silicon oxide layer (like the passivation layer 48), but even a thin nitride layer (like the barrier layer 15) reduces the diffusion of the water molecule by several orders of magnitude, acting as an ideal barrier. In some applications, the barrier layer 15 formed of silicon nitride may further passivate the active layer 24. In such case, there may be no need for the passivation layer 48. The barrier layer 15 may be formed by a chemical vapor deposition system such as a plasma enhanced chemical vapor deposition (PECVD) system, or an atomic layer deposition (ALD) system.

A nanotube liquid mixture 79 is then applied over the barrier layer 15, as shown in FIG. 10. The nanotube liquid mixture 79 is formed from the nanotube particles 17 dispersed in a liquid solvent material 80 that is eligible to evaporate at a certain temperature. In a non-limiting example, the liquid solvent material 80 may be water or an alcohol-based solution. The nanotube particles 17 may be any nanotube particles with a high thermal conductivity (between 2 w/m·k and 5000 w/m·k) and a high electrical resistivity (greater than 1E6 Ohm-cm). In a non-limiting example, the nanotube particles 17 may be boron nitride nanotube particles, aluminum nitride nanotube particles, diamond nanotube particles, or carbon nanotube particles satisfying both the thermal conductivity (greater than 2 w/m·k) and electrical resistivity requirements (greater than 1E6 Ohm-cm).

In this embodiment, the nanotube liquid mixture 79 is evenly and continuously spread over the entire barrier layer 15. If there is no barrier layer 15, the nanotube liquid mixture 79 may be directly spread over each passivation layer 48 and directly over inner side surfaces and the top surfaces of the isolation sections 44 (not shown). If there is no barrier layer 15 and no passivation layer 48, the nanotube liquid mixture 79 may be directly spread over each individual buffer structure 70I/interfacial layer 66I, and directly over inner side surfaces and the top surfaces of the isolation sections 44 (not shown). If there is no barrier layer 15, no passivation layer 48, and no individual buffer structure 70I/interfacial layer 66I, the nanotube liquid mixture 79 may be directly spread over each active layer 24 and directly over inner side surfaces and the top surfaces of the isolation sections 44 (not shown).

Figures 11, 12:
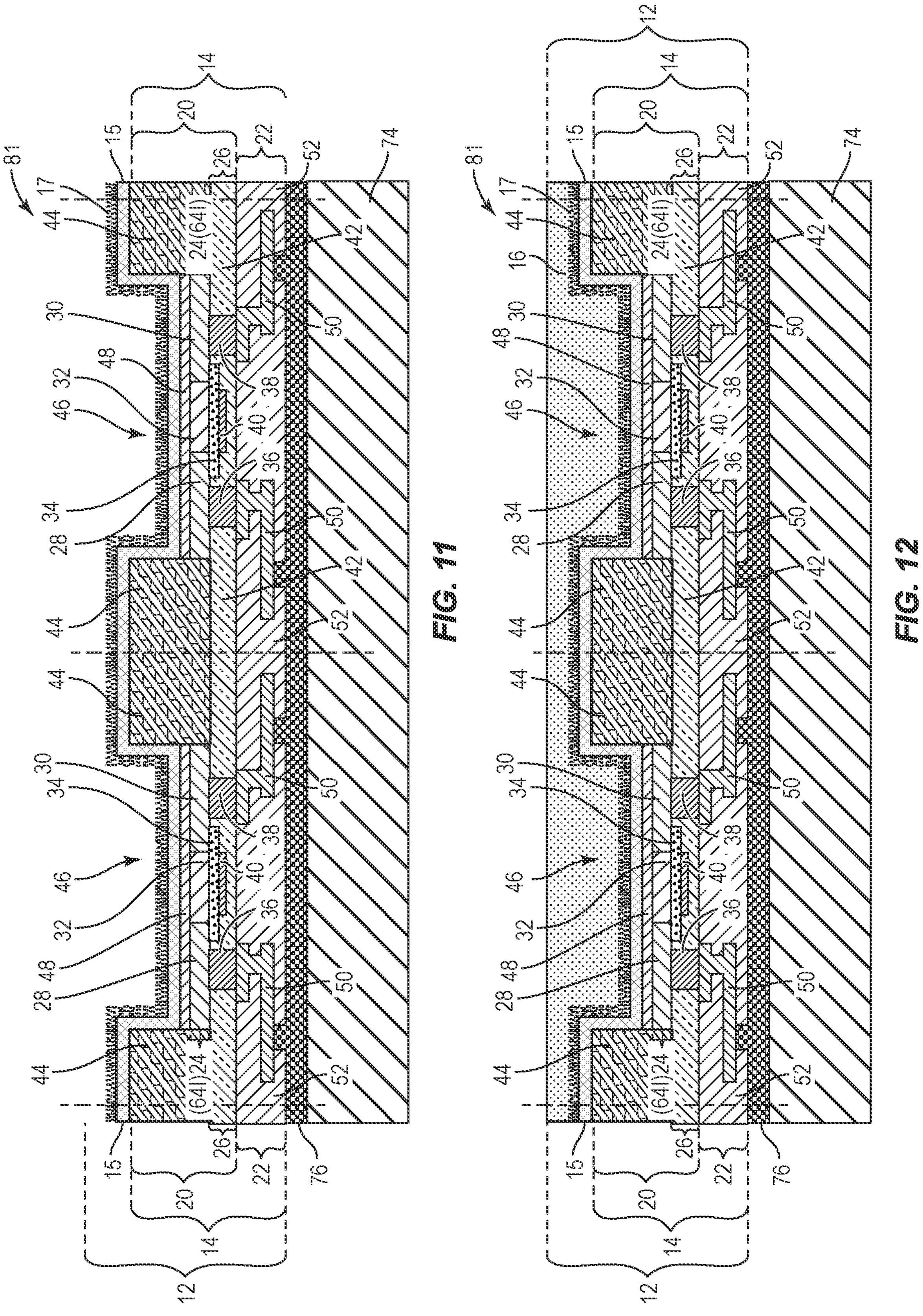

A baking step is then followed to evaporate the liquid solvent material 80 within the nanotube liquid mixture 79, as illustrated in FIG. 11. Depending on different materials of the liquid solvent material 80, a baking temperature and a baking time for the nanotube liquid mixture 79 may be different. After the baking step, the liquid solvent material 80 is completely removed and only an array of the nanotube particles 17 remains. Some of the nanotube particles 17 adhere to the barrier layer 15 and to the rest of the nanotube particles 17 via Van Der Walls forces, leaving the array of interconnected nanotube particles 17.

Next, the first mold compound 16 is applied over the barrier layer 15 to provide a mold device wafer 81, as illustrated in FIG. 12. The mold device wafer 81 includes a number of the mold device dies 12, each of which includes the device region 14, a portion of the barrier layer 15, a portion of the nanotube particles 17, and a portion of the first mold compound 16. Herein, the first mold compound 16 does not dislodge the nanotube particles 17. Instead, the first mold compound fills the gaps among the nanotube particles 17. As such, the nanotube particles 17 are dispersed throughout the bottom portion of the first mold compound 16. In addition, the first mold compound 16 fills each opening 46 and further extends over the isolation sections 44. Notice that, regardless of the presence of the barrier layer 15, the passivation layer 48, or the interfacial layer 66/the buffer structure 70 (not shown in FIG. 12), silicon crystal, which has no germanium, nitrogen, or oxygen content, does not exist between the bottom portion of the first mold compound 16 (which is mixed with the nanotube particles 17) and the top surface of the active layer 24. Each of the barrier layer 15, the passivation layer 48, and the interfacial layer 66/the buffer structure 70 (not shown in FIG. 12) is formed of silicon composite.

In order to keep the nanotube particles 17 at an interface with the barrier layer 15 (or at an interface with each passivation layer 48, or at an interface with each individual buffer structure 70I/individual interfacial layer 66I, or at an interface with each active layer 24), the first mold compound 16 may be applied by various molding procedures with appropriate pressure so as not to dislodge the nanotube particles 17, such as compression molding, sheet molding, overmolding, transfer molding, dam fill encapsulation, and screen print encapsulation. The first mold compound 16 may have a thermal conductivity between 1 w/m·k and 20 w/m·k, and a high electrical resistivity greater than 1E6 Ohm-cm. Typically, the thermal conductivity of the nanotube particles 17 is higher than the thermal conductivity of the first mold compound 16. Consequently, the bottom portion of the first mold compound 16 mixed with the nanotube particles 17 has a greater thermal conductivity than the rest portion (upper portion) of the first mold compound 16 alone. During the molding process of the first mold compound 16, the temporary carrier 74 provides mechanical strength and rigidity to the etched wafer 78. A curing process (not shown) is then performed to harden the first mold compound 16. The curing temperature is between 100° C. and 320° C. depending on which material is used as the first mold compound 16. After the curing process, the first mold compound 16 may be thinned and/or planarized (not shown).

Figure 13:
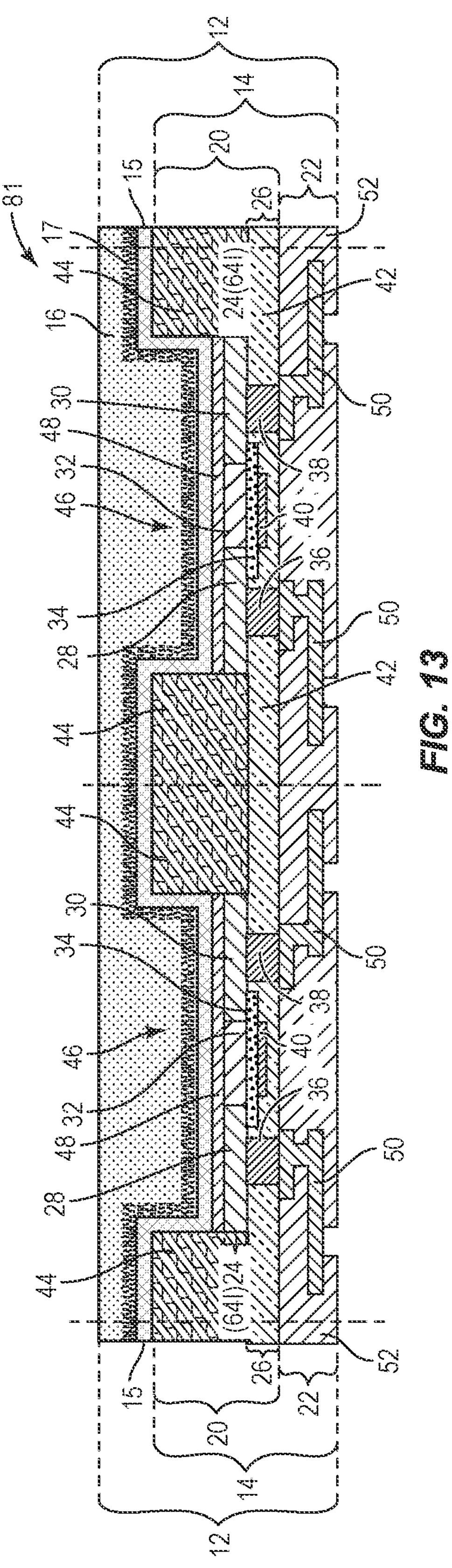

The temporary carrier 74 is then debonded from the mold device wafer 81, and the bonding layer 76 is cleaned from the mold device wafer 81, as illustrated in FIG. 13. A number of debonding processes and cleaning processes may be applied depending on the nature of the temporary carrier 74 and the bonding layer 76 chosen in the earlier steps. For instance, the temporary carrier 74 may be mechanically debonded using a lateral blade process with the stack heated to a proper temperature. Other suitable processes involve radiation of UV light through the temporary carrier 74 if it is formed of a transparent material, or chemical debonding using a proper solvent. The bonding layer 76 may be eliminated by wet or dry etching processes, such as proprietary solvents and plasma washing. After the debonding and cleaning process, the bottom portions of certain ones of the multiple connecting layers 50, which may function as input/output (I/O) ports of the mold device die 12, are exposed through the dielectric layers 52 at the bottom surface of each BEOL portion 22. As such, each mold device die 12 in the mold device wafer 81 may be electrically verified to be working properly at this point.

Figure 14:
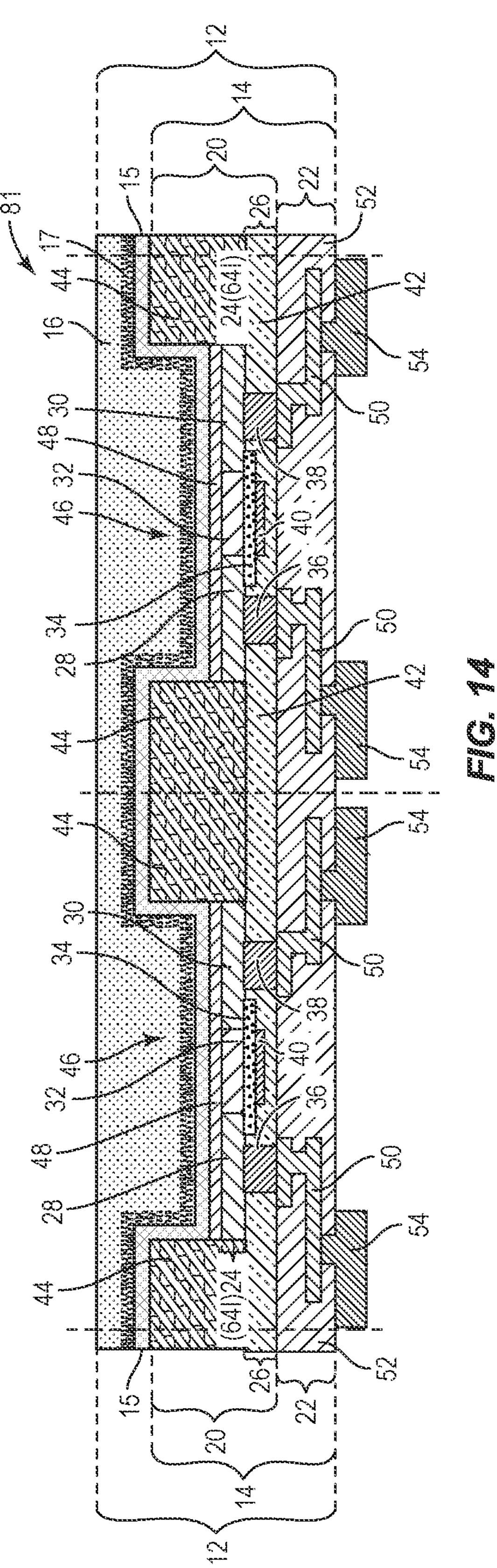
Figures 15, 16:
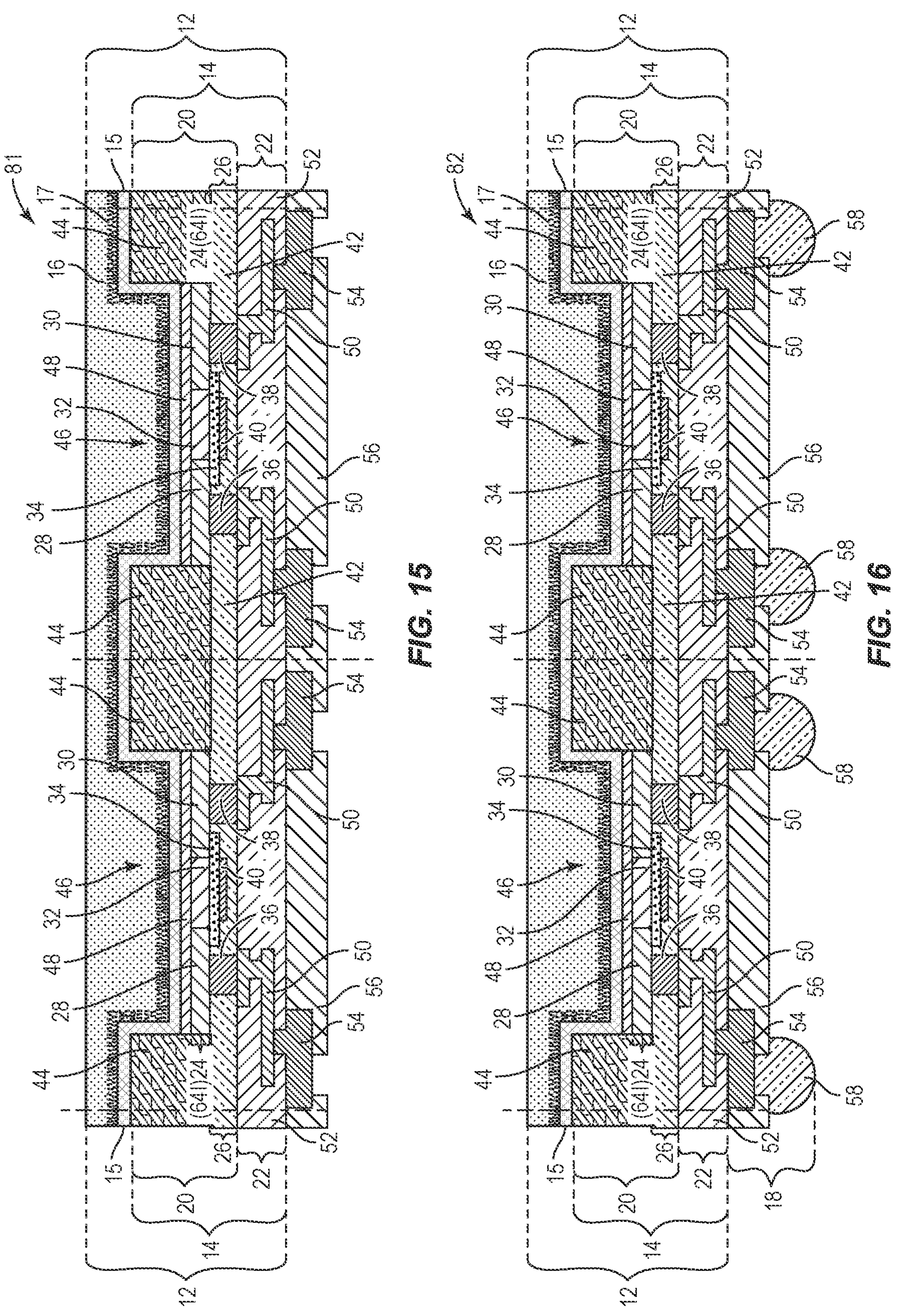

With reference to FIGS. 14 through 16, the multilayer redistribution structure 18 is formed underneath the mold device wafer 81 according to one embodiment of the present disclosure. Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 14-16.

A number of the redistribution interconnections 54 are firstly formed underneath each BEOL portion 22, as illustrated in FIG. 14. Each redistribution interconnection 54 is electrically coupled to the exposed bottom portion of the corresponding connecting layer 50 within the BEOL portion 22, and may extend over the bottom surface of the BEOL portion 22. The connections between the redistribution interconnections 54 and the connecting layers 50 are solder-free. The dielectric pattern 56 is then formed underneath each BEOL portion 22 to partially encapsulate each redistribution interconnection 54, as illustrated in FIG. 15. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide a wafer-level fan-out (WLFO) package 82, as illustrated in FIG. 16. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layer 50 in the BEOL portion 22, which are electrically connected to the FEOL portion 20. As such, the bump structures 58 are electrically connected to the FEOL portion 20 via corresponding redistribution interconnections 54 and corresponding connecting layers 50. In addition, the bump structures 58 are separate from each other and protrude vertically from the dielectric pattern 56.

Figures 17, 18:
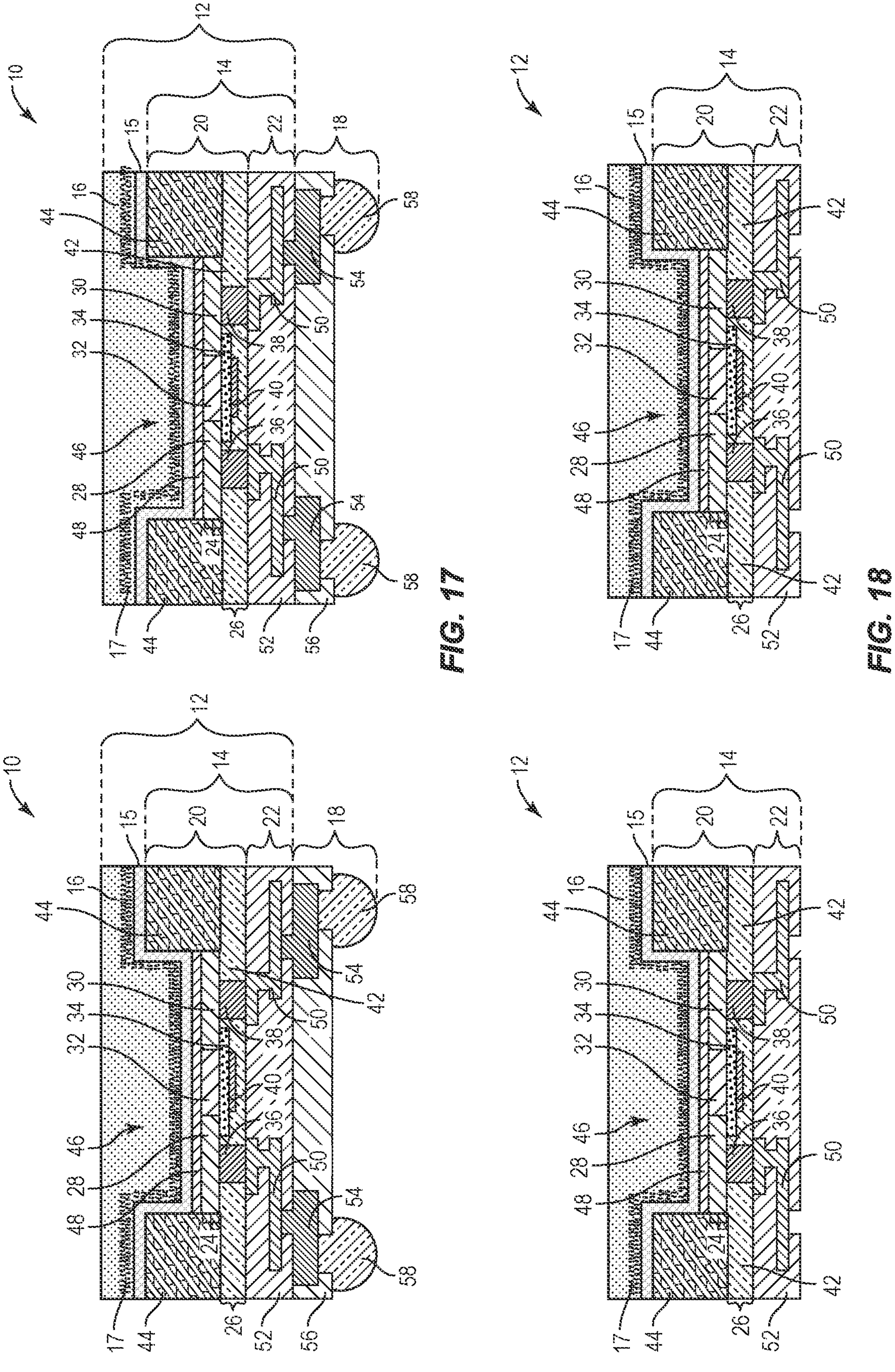

The multilayer redistribution structure 18 may be free of glass fiber or glass-free. Herein, the glass fiber refers to individual glass strands twisted to become a larger grouping. These glass strands may then be woven into a fabric. The redistribution interconnections 54 may be formed of copper or other suitable metals, the dielectric pattern 56 may be formed of BCB, polyimide, or other dielectric materials, and the bump structures 58 may be solder balls or copper pillars. The multilayer redistribution structure 18 has a thickness between 2 μm and 300 μm. FIG. 17 shows a final step to singulate the WLFO package 82 into individual RF devices 10. The singulating step may be provided by a probing and dicing process at certain isolation sections 44.

In another embodiment, FIGS. 18-23 provide an alternative process that illustrates steps to fabricate the alternative RF device 10A shown in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 18-23.

After the debonding and cleaning process to provide the clean mold device wafer 81 as shown in FIG. 13, a singulating step is performed to singulate the mold device wafer 81 into individual mold device dies 12, as illustrated in FIG. 18. This singulating step may be provided by a probing and dicing process at certain isolation sections 44. Herein, each mold device die 12 may have a same height and includes the device region 14 with the FEOL portion 20 and the BEOL portion 22, the barrier layer 15, and the first mold compound 16 mixed with the nanotube particles 17.

Figures 19, 20:
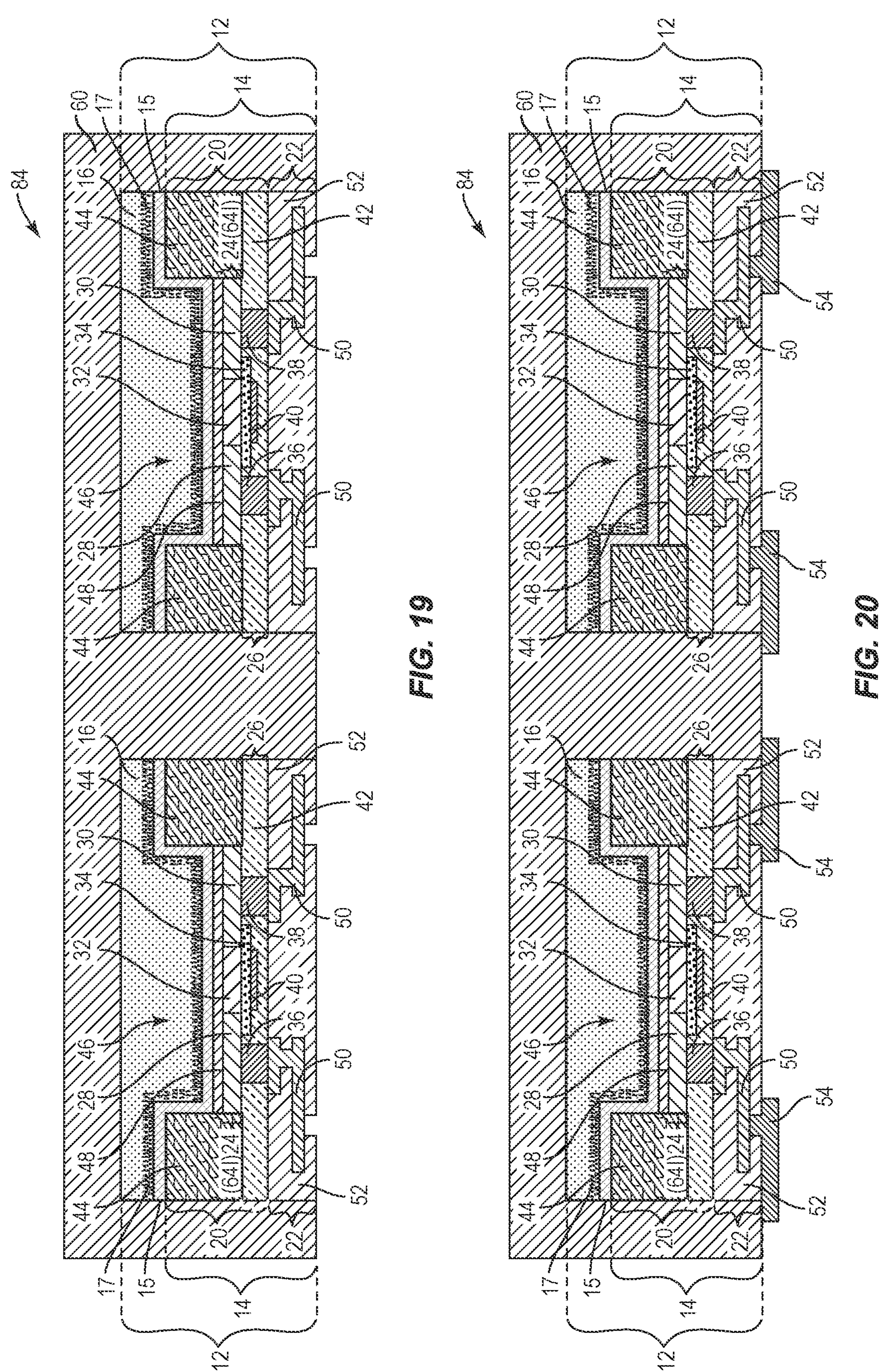

Next, the second mold compound 60 is applied around and over the mold device dies 12 to provide a double mold device wafer 84, as illustrated in FIG. 19. The second mold compound 60 encapsulates a top surface and side surfaces of each mold device die 12, while a bottom surface of each mold device die 12, which is the bottom surface of the BEOL portion 22, is exposed. A bottom surface of the double mold device wafer 84 is a combination of the bottom surface of each mold device die 12 and a bottom surface of the second mold compound 60. Herein, the bottom portions of certain ones of the connecting layers 50 remain exposed at the bottom surface of each mold device die 12. The second mold compound 60 may be applied by various procedures, such as sheet molding, overmolding, compression molding, transfer molding, dam fill encapsulation, or screen print encapsulation. The second mold compound 60 may be formed of the same or different material as the first mold compound 16.

However, unlike the first mold compound 16, the second mold compound 60 does not have thermal conductivity or electrical resistivity requirements. The second mold compound 60 may be an organic epoxy resin system or the like. A curing process (not shown) is then used to harden the second mold compound 60. The curing temperature is between 100° C. and 320° C. depending on which material is used as the second mold compound 60. A grinding process (not shown) may be performed to provide a planarized top surface of the second mold compound 60.

Figures 21, 22:
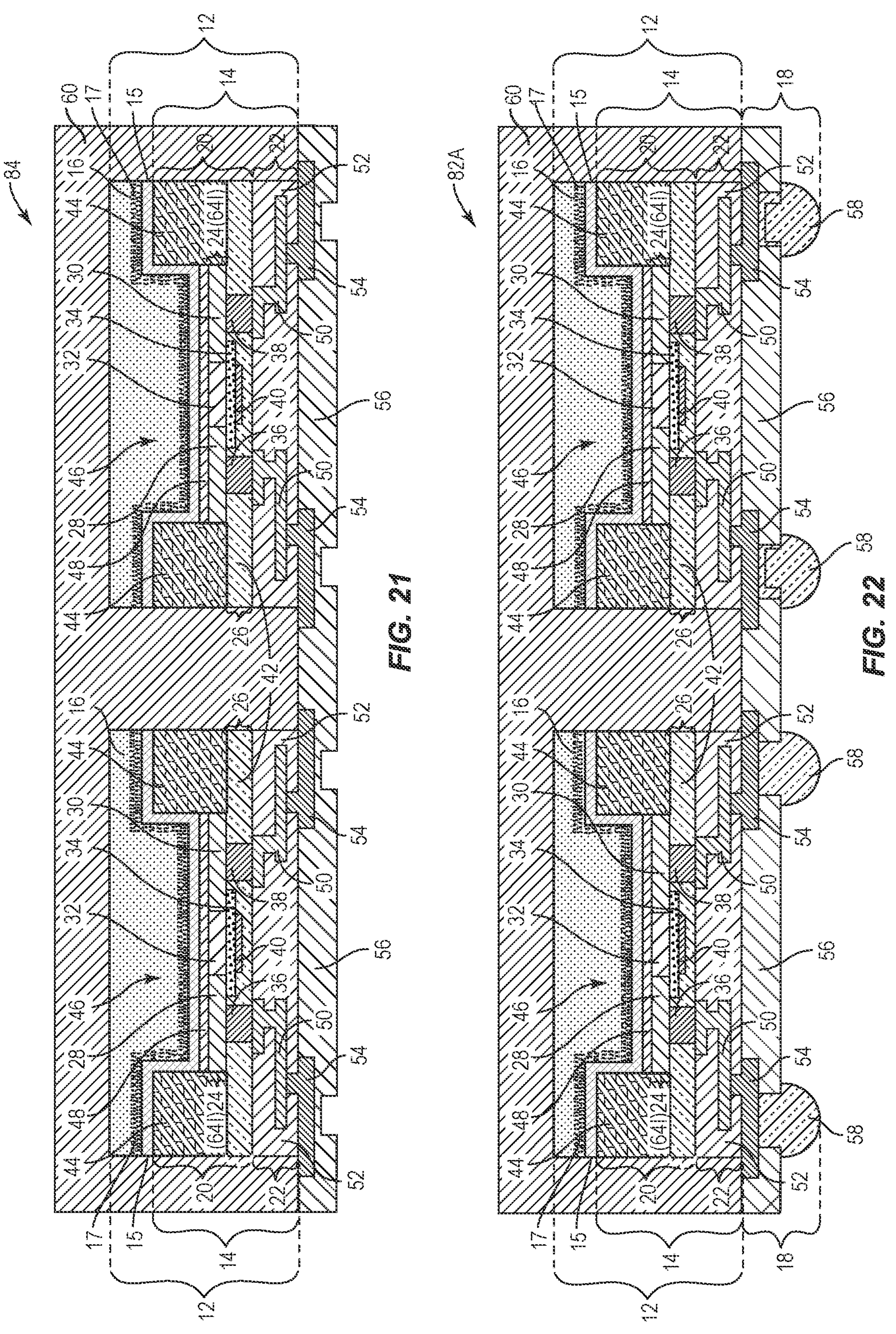

With reference to FIGS. 20 through 22, the multilayer redistribution structure 18 is formed according to one embodiment of the present disclosure.

Although the redistribution steps are illustrated in a series, the redistribution steps are not necessarily order dependent. Some steps may be done in a different order than that presented. Further, redistribution steps within the scope of this disclosure may include fewer or more steps than those illustrated in FIGS. 20-22.

A number of the redistribution interconnections 54 are firstly formed underneath the double mold device wafer 84, as illustrated in FIG. 20. Each redistribution interconnection 54 is electrically coupled to the corresponding connecting layer 50 within the BEOL portion 22, and may extend horizontally beyond the corresponding mold device die 12 and underneath the second mold compound 60. The connections between the redistribution interconnections 54 and the connecting layers 50 are solder-free. The dielectric pattern 56 is then formed underneath the double mold device wafer 84 to partially encapsulate each redistribution interconnection 54, as illustrated in FIG. 21. As such, the bottom portion of each redistribution interconnection 54 is exposed through the dielectric pattern 56. In different applications, there may be extra redistribution interconnections (not shown) electrically coupled to the redistribution interconnection 54 through the dielectric pattern 56, and extra dielectric patterns (not shown) formed underneath the dielectric pattern 56, such that a bottom portion of each extra redistribution interconnection is exposed.

Next, a number of the bump structures 58 are formed to complete the multilayer redistribution structure 18 and provide an alternative WLFO package 82A, as illustrated in FIG. 22. Each bump structure 58 is formed at the bottom of the multilayer redistribution structure 18 and electrically coupled to an exposed bottom portion of the corresponding redistribution interconnection 54 through the dielectric pattern 56. Consequently, the redistribution interconnections 54 are configured to connect the bump structures 58 to certain ones of the connecting layers 50 in the BEOL portion 22, which are electrically connected to the FEOL portion 20. As such, the bump structures 58 are electrically connected to the FEOL portion 20 via corresponding redistribution interconnections 54 and corresponding connecting layers 50. Herein, the bump structures 58 may not be confined within a periphery of a corresponding mold device die 12. In addition, the bump structures 58 are separate from each other and protrude vertically from the dielectric pattern 56.

Figure 23:
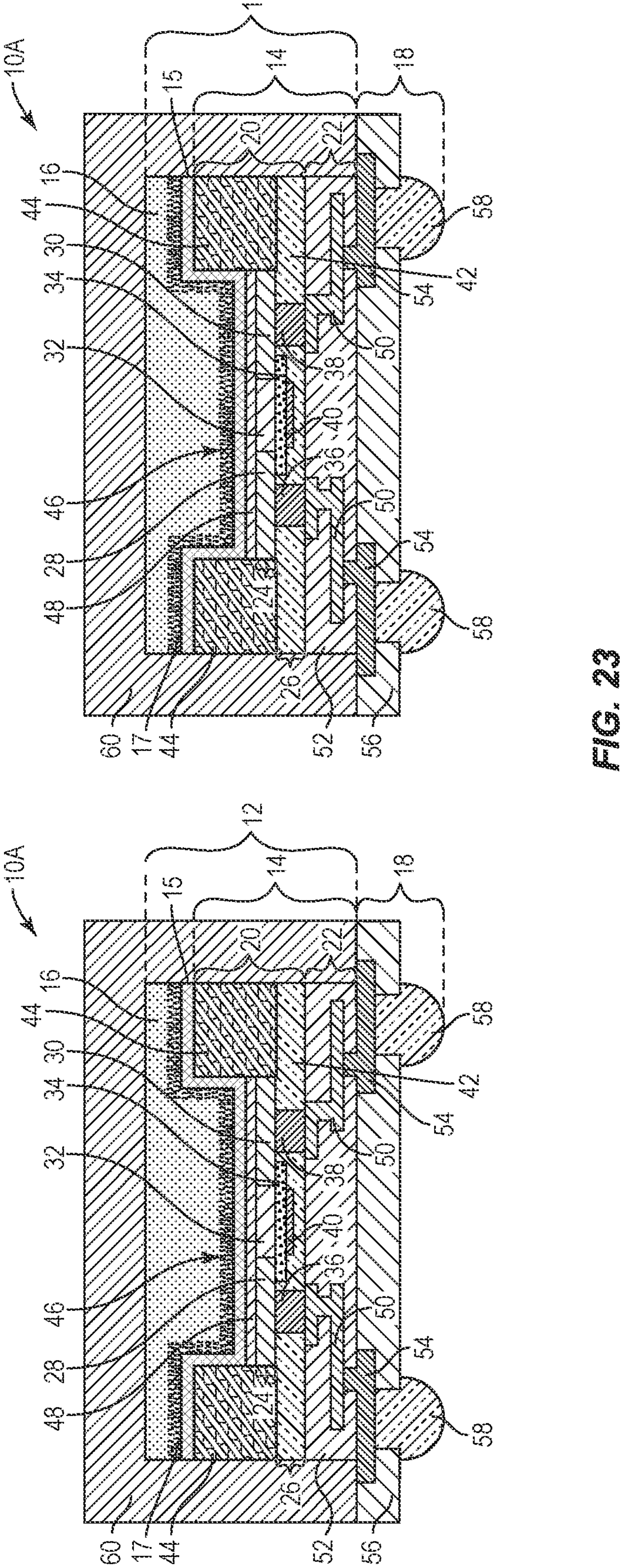

FIG. 23 shows a final step to singulate the alternative WLFO package 82A into individual alternative RF devices 10A. The singulating step may be provided by a probing and dicing process at portions of the second mold compound 60, which are horizontally between adjacent mold device dies 12.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:

forming a precursor wafer comprising a plurality of device regions, each of which includes a back-end-of-line (BEOL) portion and a front-end-of-line (FEOL) portion, wherein:

the FEOL portion comprises a contact layer, isolation sections, and an active layer, which is surrounded by the isolation sections and does not extend vertically beyond the isolation sections;

a bottom surface of the active layer and a bottom surface of each of the isolation sections are substantially coplanar and are in contact with a top surface of the contact layer, and the BEOL portion is underneath a bottom surface of the contact layer; and the FEOL portion is configured to provide at least one field-effect transistor (FET), wherein the active layer includes a source, a drain, and a channel of the at least one FET, while the contact layer includes a gate structure of the at least one FET, the gate structure extending horizontally underneath the channel;

removing a silicon handle substrate completely from the precursor wafer to provide an etched wafer, wherein:

the silicon handle substrate is positioned over each of a plurality of interfacial layers, which is positioned vertically over the active layer of a corresponding one of the plurality of device regions, respectively; and each of the plurality of interfacial layers is formed of silicon germanium (SiGe), and each active layer is formed from an individual silicon epitaxial layer;

applying a barrier layer over an entire backside of the etched wafer, such that the barrier layer covers at least a top surface of the active layer of each of the plurality of device regions;

forming nanotube particles directly over the barrier layer; and applying a first mold compound over the barrier layer to provide a mold device wafer, wherein:

the first mold compound fills gaps among the nanotube particles, and the nanotube particles are dispersed throughout a bottom portion of the first mold compound; and the mold device wafer includes a plurality of mold device dies, each of which includes a corresponding device region, a portion of the barrier layer over the corresponding device region, and the bottom portion of the first mold compound with the nanotube particles over the portion of the barrier layer.

2. The method of claim 1 wherein:

the nanotube particles have a thermal conductivity between 2 w/m·k and 5000 w/m·k and an electrical resistivity greater than 1E6 Ohm-cm;

the first mold compound alone has a thermal conductivity between 1 w/m·k and 20 w/m·k and an electrical resistivity greater than 1E6 Ohm-cm; and the bottom portion of the first mold compound mixed with the nanotube particles has a higher thermal conductivity than a remaining portion of the first mold compound alone.

3. The method of claim 2, wherein the bottom portion of the first mold compound mixed with the nanotube particles has a thickness between 1 μm and 100 μm.

4. The method of claim 2, wherein the nanotube particles are boron nitride nanotube particles, aluminum nitride nanotube particles, diamond nanotube particles, or carbon nanotube particles.

5. The method of claim 1, wherein the barrier layer is formed of silicon nitride with a thickness between 100 Å and 10 μm.

6. The method of claim 1 wherein the FEOL portion is configured to further provide at least one of a diode, a capacitor, a resistor, or an inductor.

7. The method of claim 1 wherein:

the isolation sections are formed of silicon dioxide, and extend vertically beyond the top surface of the active layer to define an opening within the isolation sections and over the top surface of the active layer; and the barrier layer continuously extends over the top surface of the active layer and inner side surfaces of the isolation sections within the opening, and over top surfaces of the isolation sections.

8. The method of claim 1, wherein the individual silicon epitaxial layer is a strained silicon epitaxial layer, in which a lattice constant of silicon is greater than 5.461 at a temperature of 300K.

9. The method of claim 1 further comprising:

bonding the precursor wafer to a temporary carrier via a bonding layer before the silicon handle substrate is removed; and debonding the temporary carrier and cleaning the bonding layer from the mold device wafer after the first mold compound is applied.

10. The method of claim 1 further comprising forming a multilayer redistribution structure underneath the mold device wafer, wherein:

the multilayer redistribution structure comprises a plurality of bump structures on a bottom surface of the multilayer redistribution structure and redistribution interconnections within the multilayer redistribution structure; and each of the plurality of bump structures is electrically coupled to one active layer of a corresponding mold device die via the redistribution interconnections and connecting layers within the BEOL portion of the corresponding mold device die.

11. The method of claim 1 further comprising:

singulating the mold device wafer into a plurality of individual mold device dies;

applying a second mold compound around and over the plurality of individual mold device dies to provide a double mold device wafer, wherein:

the second mold compound encapsulates a top surface and side surfaces of each of the plurality of individual mold device dies, while a bottom surface of each of the plurality of individual mold device dies is exposed; and a bottom surface of the double mold device wafer is a combination of the bottom surface of each of the plurality of individual mold device dies and a bottom surface of the second mold compound; and forming a multilayer redistribution structure underneath the double mold device wafer, wherein:

the multilayer redistribution structure comprises a plurality of bump structures on a bottom surface of the multilayer redistribution structure and redistribution interconnections within the multilayer redistribution structure; and each of the plurality of bump structures is electrically coupled to one active layer of a corresponding individual mold device die via the redistribution interconnections within the multilayer redistribution structure and connecting layers within the BEOL portion of the corresponding individual mold device die.

12. The method of claim 1 wherein:

the plurality of interfacial layers are separate from each other, and each of the plurality of interfacial layers has a uniform concentration of germanium greater than 15.

13. The method of claim 12 wherein the precursor wafer further comprises a plurality of individual buffer structures, wherein:

each of the plurality of individual buffer structures resides between the silicon handle substrate and a corresponding interfacial layer;

each of the plurality of individual buffer structures is formed of SiGe with a vertically graded germanium concentration;

the vertically graded germanium concentration within each of the plurality of individual buffer structures increases from the silicon handle substrate to the corresponding interfacial layer;

each of the plurality of interfacial layers is not strained by the silicon handle substrate, and has a lattice constant greater than 5.461 at a temperature of 300K; and the individual silicon epitaxial layer used to form the active layer of the corresponding device region is grown over and strained by a corresponding interfacial layer, wherein a lattice constant of silicon in the individual silicon epitaxial layer is greater than 5.461 at a temperature of 300K.

14. The method of claim 13 further comprising removing each of the plurality of individual buffer structures and each of the plurality of interfacial layers after removing the silicon handle substrate and before applying the barrier layer.

15. The method of claim 14 wherein the active layer of each of the plurality of device regions is in contact with the barrier layer after the barrier layer is applied.

16. The method of claim 14 further comprising applying a passivation layer directly over the active layer of each of the plurality of device regions after removing each of the plurality of individual buffer structures and each of the plurality of interfacial layers and before applying the barrier layer, wherein:

the passivation layer is formed of silicon dioxide; and the barrier layer is directly over each passivation layer after the passivation layer is applied.

17. The method of claim 16, wherein the passivation layer is applied by one of a group consisting of a plasma enhanced deposition process, an anodic oxidation process, and an ozone-based oxidation process.

18. The method of claim 12 wherein the precursor wafer further comprises a plurality of individual buffer structures, wherein:

each of the plurality of individual buffer structures resides between a corresponding one of the plurality of interfacial layers and one active layer of the corresponding device region;

each of the plurality of individual buffer structures is formed of SiGe with a vertically graded germanium concentration;

the vertically graded germanium concentration within each of the plurality of individual buffer structures increases from the corresponding individual interfacial layer to the active layer of the corresponding device region; and the individual silicon epitaxial layer used to form the active layer of the corresponding device region is grown over a corresponding individual buffer structure, wherein a lattice constant of silicon in the individual silicon epitaxial layer is greater than a lattice constant of silicon in the silicon handle substrate.

19. The method of claim 1 wherein forming the precursor wafer comprises:

providing a starting wafer that includes a common silicon epitaxial layer, a common interfacial layer over the common silicon epitaxial layer, and the silicon handle substrate over the common interfacial layer, wherein the common interfacial layer is formed of SiGe with a uniform concentration of germanium greater than 15%; and performing a complementary metal-oxide-semiconductor (CMOS) process to provide the precursor wafer, wherein:

the isolation sections extend through the common silicon epitaxial layer and the common interfacial layer, and extend into the silicon handle substrate, such that the common interfacial layer is separated into the plurality of interfacial layers individually, and the common silicon epitaxial layer is separated into the plurality of individual silicon epitaxial layers.

20. The method of claim 19 wherein the starting wafer further includes a common buffer structure between the silicon handle substrate and the common interfacial layer, wherein:

the common buffer structure is formed of SiGe with a vertically graded germanium concentration;

the vertically graded germanium concentration within the common buffer structure increases from the silicon handle substrate to the common interfacial layer;

the common interfacial layer is not strained by the silicon handle substrate, and has a lattice constant greater than 5.461 at a temperature of 300K; and the common silicon epitaxial layer is grown over and strained by the common interfacial layer, wherein a lattice constant of silicon in the common silicon epitaxial layer is greater than 5.461 at a temperature of 300K.

21. The method of claim 20 wherein:

the isolation sections extend through the common silicon epitaxial layer, the common interfacial layer, the common buffer structure, and extend into the silicon handle substrate, such that the common buffer structure is separated into a plurality of individual buffer structures, the common interfacial layer is separated into the plurality of individual interfacial layers, and the common silicon epitaxial layer is separated into the plurality of individual silicon epitaxial layers; and each of the plurality of individual buffer structures directly resides over a corresponding interfacial layer, and the silicon handle substrate resides directly over the plurality of individual buffer structures.

22. The method of claim 19 wherein the starting wafer further includes a common buffer structure between the common interfacial layer and the common silicon epitaxial layer, wherein:

the common buffer structure is formed of SiGe with a vertically graded germanium concentration;

the vertically graded germanium concentration within the common buffer structure increases from the common interfacial layer to the common silicon epitaxial layer; and the common silicon epitaxial layer is grown over the common buffer structure, wherein a lattice constant of silicon in the common silicon epitaxial layer is greater than a lattice constant of silicon in the silicon handle substrate.

23. The method of claim 1, wherein the silicon handle substrate is removed by a mechanical grinding process followed by an etching process with an etchant chemistry, which is at least one of a group consisting of tetramethylammonium hydroxide (TMAH), potassium hydroxide (KOH), sodium hydroxide (NaOH), acetylcholine (ACH), and xenon difluoride ($XeF_2$).

24. The method of claim 1 wherein the silicon handle substrate is removed by an etching process with an etchant chemistry, which is at least one of a group consisting of TMAH, KOH, NaOH, ACH, and $XeF_2$.

25. The method of claim 1 wherein forming nanotube particles directly over the barrier layer comprises:

applying a nanotube liquid mixture directly over the barrier layer, wherein the nanotube liquid mixture is formed from the nanotube particles dispersed in a liquid solvent material that is eligible to evaporate at a certain temperature; and baking the nanotube liquid mixture to evaporate the liquid solvent material within the nanotube liquid mixture and to retain the nanotube particles.

26. The method of claim 25 wherein:

the liquid solvent material is water or an alcohol-based solution; and the nanotube particles are boron nitride nanotube particles, aluminum nitride nanotube particles, diamond nanotube particles, or carbon nanotube particles.

* * * * *